(12) United States Patent
Nakamura et al.

(10) Patent No.: US 12,057,863 B2
(45) Date of Patent: Aug. 6, 2024

(54) COMMUNICATION SYSTEM, COMMUNICATION METHOD AND PROGRAM

(71) Applicant: NIPPON TELEGRAPH AND TELEPHONE CORPORATION, Tokyo (JP)

(72) Inventors: Masanori Nakamura, Musashino (JP); Takeshi Kakizaki, Musashino (JP); Shigeki Miyake, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 167 days.

(21) Appl. No.: 17/802,071

(22) PCT Filed: Feb. 25, 2020

(86) PCT No.: PCT/JP2020/007301
§ 371 (c)(1),
(2) Date: Aug. 24, 2022

(87) PCT Pub. No.: WO2021/171330
PCT Pub. Date: Sep. 2, 2021

(65) Prior Publication Data
US 2023/0091550 A1    Mar. 23, 2023

(51) Int. Cl.
*H03M 7/30*    (2006.01)
*H03M 7/14*    (2006.01)
(Continued)

(52) U.S. Cl.
CPC ............. *H03M 7/60* (2013.01); *H03M 13/05* (2013.01); *H03M 13/63* (2013.01);
(Continued)

(58) Field of Classification Search
CPC ........ H03M 7/60; H03M 13/05; H03M 13/63; H03M 7/14; H04B 10/516; H04L 1/0042; H04L 1/0045; H04L 1/0057; H04L 27/34
(Continued)

(56) References Cited

U.S. PATENT DOCUMENTS 10,516,503 B1*  12/2019  Millar .................... H04L 1/0042
11,121,903 B2*  9/2021  Torbatian .............. H04L 27/362
2021/0367675 A1  11/2021  Nakamura et al.

FOREIGN PATENT DOCUMENTS

WO    WO-2019225311 A1    11/2019

OTHER PUBLICATIONS

Georg Böcherer et al., Bandwidth Efficient and Rate-Matched Low-Density Parity-Check Coded Modulation, IEEE Transactions on Communications, vol. 63, No. 12, 2015, pp. 4651-4665.
(Continued)

*Primary Examiner* — Khai M Nguyen
(74) *Attorney, Agent, or Firm* — Harness, Dickey & Pierce, P.L.C.

(57) ABSTRACT

An aspect of the present invention is a communication system including: an encoding unit configured to transform an input symbol sequence into an output symbol sequence, the input symbol sequence being a sequence of first symbols, the output symbol sequence being a sequence of second symbols; and a decoding unit configured to transform the output symbol sequence into the input symbol sequence in accordance with a decoding-side transformation mapping for transforming the output symbol sequence into the input symbol sequence that is a transformation source for the output symbol sequence, wherein the encoding unit transforms the input symbol sequence into the output symbol sequence in accordance with encoding-side transformation destination candidate information, the input symbol sequence, and a transformation probability, the encoding-
(Continued)

side transformation destination candidate information being information indicating candidates of a transformation destination for the input symbol sequence, the transformation probability being a probability of transformation into the transformation destination indicated by the encoding-side transformation destination candidate information, and a probability of appearance of the second symbol conforms to a predefined prescribed probability distribution.

8 Claims, 13 Drawing Sheets

(51) Int. Cl.
  *H03M 13/00*    (2006.01)
  *H03M 13/05*    (2006.01)
  *H04B 10/516*    (2013.01)
  *H04L 1/00*    (2006.01)
  *H04L 27/34*    (2006.01)

(52) U.S. Cl.
  CPC ......... *H04B 10/516* (2013.01); *H04L 1/0042* (2013.01); *H04L 1/0045* (2013.01); *H04L 1/0057* (2013.01); *H04L 27/34* (2013.01); *H03M 7/14* (2013.01)

(58) Field of Classification Search
  USPC ............................................ 341/51, 87, 107
  See application file for complete search history.

(56) References Cited

OTHER PUBLICATIONS

Jun Muramatsu, Lossy Source Code Using a Constrained Random Number Generator, IEEE International Symposium on Information Theory, Jul. 7, 2013, pp. 2354-2358.

Jun Muramatsu and Shigeki Miyake, Channel Code Using Constrained-Random-Number Generator Revisited, IEEE Transactions on Information Theory, vol. 65, No. 1, 2019, pp. 500-510.

Patrick Schulte and Georg Böcherer, Constant Composition Distribution Matching, IEEE Transactions on Information Theory, vol. 62, No. 1, 2016, pp. 430-434.

Tsuyoshi Yoshida et al., Hierarchical Distribution Matching for Probabilistically Shaped Coded Modulation, Journal of Lightwave Technology, vol. 37, No. 6, 2019, pp. 1579-1589.

Marcin Pikus and Wen Xu, Bit-Level Probabilistically Shaped Coded Modulation, IEEE Communications Letters, vol. 21, No. 9, 2017, pp. 1929-1932.

* cited by examiner

COMMUNICATION SYSTEM, COMMUNICATION METHOD AND PROGRAM

CROSS-REFERENCE TO RELATED APPLICATIONS

This application is a 371 U.S. National Phase of International Application No. PCT/JP2020/007301, filed on Feb. 25, 2020. The entire disclosure of the above application is incorporated herein by reference.

TECHNICAL FIELD

The present invention relates to a communication system, a communication method, and a program.

BACKGROUND ART

In recent years, communication traffic has increased at an annual rate of approximately 130% owing to applications that require transmission or reception of a large volume of data such as video streaming or electronic sports in a short amount of time. Accordingly, techniques for increasing the capacity per transmission line have begun to become prevalent (NPLs 1 to 5).

CITATION LIST

Non Patent Literature

NPL 1: G. Böcherer, et al., "Bandwidth Efficient and Rate-Matced Low-Density Parity-Check Coded Modulation" IEEE Trans Commun., vol. 63, no. 12, pp. 4651-4655 (2015).
NPL 2: Jun Muramatsu, "Lossy Source Code Using a Constrained Random Number Generator" 2013 IEEE International Symposium on Information Theory, Istanbul, 2013, pp. 2354-2358.
NPL 3: Jun Muramatsu and Shigeki Miyake, "Channel Code Using Constrained-Random-Number Generator Revisited", IEEE Transactions on Information Theory, 2018, 65.1:500-510.
NPL 4: Patrick. Schulte et al., "Constant Composition Distribution Matching", IEEE Trans. Inf. Theory, vol. 62, no. 1, pp. 430-434 (2016).
NPL 5: Tsuyoshi Yoshida et al., "Hierarchical Distribution Matching for Probabilistically Shaped Coded Modulation", J. Lightw. Technol., vol. 37, No. 6, pp. 1579-1589 (2019).
NPL 6: M. Pikus and W. Xu, "Bit-level probabilistically shaped coded modulation," IEEE Commun. Lett., vol. 21, no. 9, pp. 1929-1932, September 2017.

SUMMARY OF THE INVENTION

Technical Problem

In a case that a large volume of data is transmitted or received in a short amount of time, a transmission line such as an optical fiber may be used. However, in techniques in which it is important to transmit or receive a large volume of data such as video streaming or electronic sports in a short amount of time, the current transmission capacity per transmission line such as optical fiber may be insufficient.

In view of the above circumstances, an object of the present invention is to provide a technique capable of increasing a transmission capacity of a transmission line.

Means for Solving the Problem

An aspect of the present invention is a communication system including: an encoding unit configured to transform an input symbol sequence into an output symbol sequence, the input symbol sequence being a sequence of first symbols, the output symbol sequence being a sequence of second symbols; and a decoding unit configured to transform the output symbol sequence into the input symbol sequence in accordance with a decoding-side transformation mapping for transforming the output symbol sequence into the input symbol sequence that is a transformation source for the output symbol sequence, wherein the encoding unit transforms the input symbol sequence into the output symbol sequence in accordance with encoding-side transformation destination candidate information, the input symbol sequence, and a transformation probability, the encoding-side transformation destination candidate information being information indicating candidates of a transformation destination for the input symbol sequence, the transformation probability being a probability of transformation into the transformation destination indicated by the encoding-side transformation destination candidate information, and a probability of appearance of the second symbol conforms to a predefined prescribed probability distribution.

Effects of the Invention

According to the present invention, the transmission capacity of the transmission line can be increased.

DESCRIPTION OF EMBODIMENTS

Figure 1:
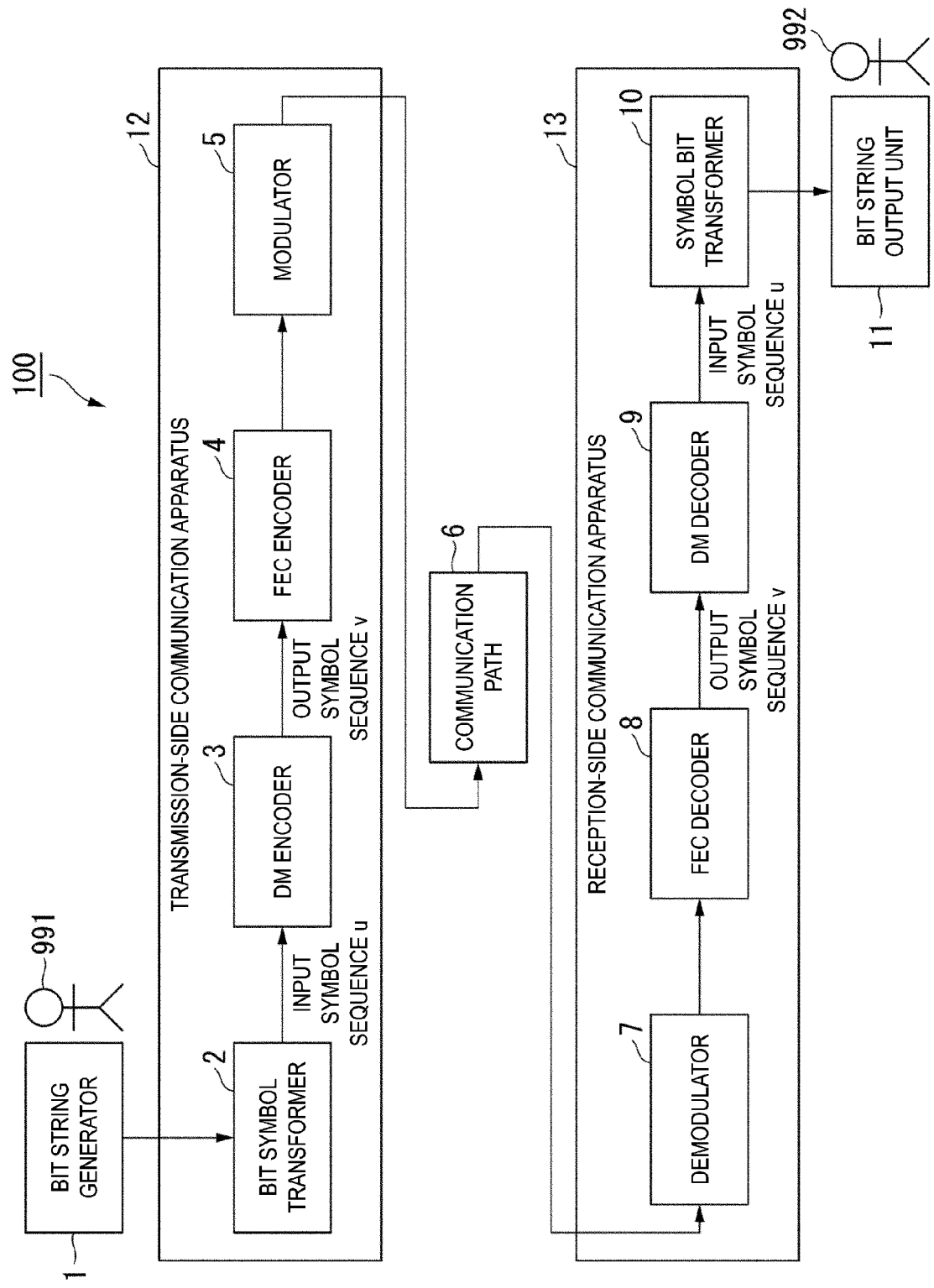
FIG. 1 is an explanatory diagram illustrating an example of a system configuration of a communication system 100 according to an embodiment.

FIG. 1 is an explanatory diagram illustrating an example of a system configuration of a communication system 100 according to an embodiment. The communication system 100 includes a bit string generator 1, a bit symbol transformer 2, a distribution matcher (DM) encoder 3, a forward error correction (FEC) encoder 4, a modulator 5, a communication path 6, a demodulator 7, an FEC decoder 8, a DM decoder 9, a symbol bit transformer 10, and a bit string output unit 11.

The bit string generator 1 generates a bit string representing content that a sending person 991 desires to transmit (hereinafter referred to as a "transmission content bit string"). The bit string generator 1 is, for example, an information device such as a personal computer, a smartphone, a tablet, or a workstation. The transmission content bit string is an electrical signal. The transmission content bit string is specifically a sequence of information source signs.

The bit symbol transformer 2, the DM encoder 3, the FEC encoder 4, and the modulator 5 are configured as one piece and operate as a transmission-side communication apparatus 12. The transmission-side communication apparatus 12 is, for example, a communication apparatus such as an optical line termination apparatus.

The demodulator 7, the FEC decoder 8, the DM decoder 9, the symbol bit transformer 10, and the bit string output unit 11 are configured as one piece and operate as a reception-side communication apparatus 13. The reception-side communication apparatus 13 is, for example, a communication apparatus such as an optical line termination apparatus.

The bit symbol transformer 2 transforms the transmission content bit string into a sequence conforming to a first probability distribution. Transforming the transmission content bit string into a sequence conforming to the first probability distribution specifically means generating an input symbol sequence u. The input symbol sequence u is a sequence representing bits of a transmission content bit string by a sequence of first symbols, where a probability of appearance of each first symbol conforms to the first probability distribution. That is, the input symbol sequence u is a sequence of data points, where each data point has a value representing any one of a plurality of first symbols predefined, and the probability of appearance of each first symbol conforms to the first probability distribution.

The value representing the first symbol is a plurality of predefined discrete values. That is, the value representing the first symbol is a random variable in which the probability of appearance conforms to the first probability distribution. The value representing the first symbol is, for example, a binary value. The value representing the first symbol is, for example, an odd number. The first symbol represents, for example, a magnitude of an amplitude of a signal. The first probability distribution is, for example, a uniform distribution. The input symbol sequence u is an electrical signal.

Figure 2:
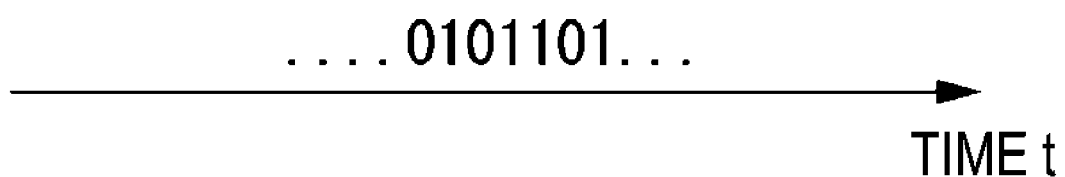
FIG. 2 is a diagram illustrating an example of a sequence conforming to a first probability distribution according to an embodiment.

FIG. 2 is a diagram illustrating an example of a sequence conforming to the first probability distribution according to an embodiment. In FIG. 2, the first symbol is 0 or 1. FIG. 2 illustrates a sequence in which 0 and 1 appear randomly. In other words, the first probability distribution of the sequence illustrated in FIG. 2 is uniform.

Figure 3:
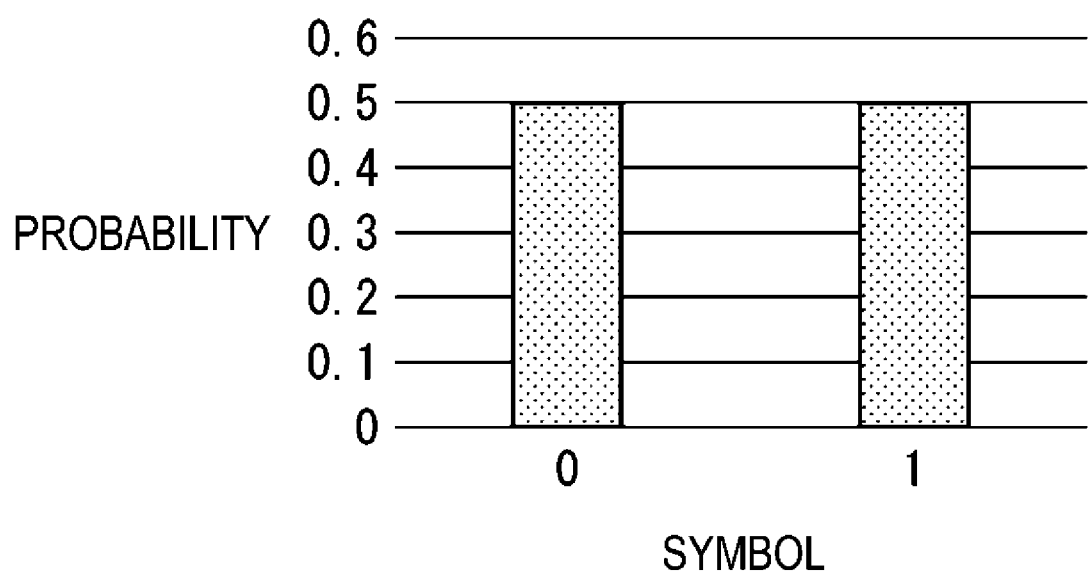
FIG. 3 is a diagram illustrating an example of the first probability distribution according to an embodiment.

FIG. 3 is a diagram illustrating an example of the first probability distribution according to an embodiment. In FIG. 3, the first symbol is 0 or 1. A vertical axis in FIG. 3 represents the probability of appearance of each of 0 and 1 in the sequence illustrated in FIG. 2. FIG. 3 illustrates the probability of appearance of 0 is 50% and the probability of appearance of 1 is 50%.

The description returns to FIG. 1. The DM encoder 3 performs a DM process on the input symbol sequence u. The DM encoder 3 performs the DM process to transform the input symbol sequence u into an output symbol sequence v. The output symbol sequence v is a sequence representing bits of a transmission content bit string by a sequence of second symbols, where a probability of appearance of each second symbol conforms to a second probability distribution. In other words, the output symbol sequence v is a sequence of the data points, where each data point has a value representing any one of a plurality of second symbols predefined, and the probability of appearance of each second symbol conforms to the second probability distribution. A code length (i.e., the number of bits) of the output symbol sequence v is longer than a code length of the input symbol sequence u.

The value representing the second symbol is a plurality of predefined discrete values. That is, the value representing the second symbol is a random variable in which the probability of appearance conforms to the second probability distribution. Hereinafter, for ease of explanation, the value representing the first symbol is also referred to as the first symbol. The second symbol may be the same as or different from the first symbol. For example, the first symbol may be a numeral, and the second symbol may be an alphabet. For example, the first symbol may be an alphabet, and the second symbol may be a Chinese character. For example, the first symbol may be 0 or 1, and the second symbol may be an odd number. The second symbol represents, for example, a magnitude of an amplitude of a signal. The second probability distribution is a non-uniform distribution. The non-uniform distribution is a biased distribution. The second probability distribution is, for example, a Gaussian distribution. The second probability distribution is, for example, a Bernoulli distribution. The output symbol sequence v is, for example, an electrical signal.

Hereinafter, for ease of explanation, the value representing the first symbol is also referred to as the first symbol. Hereinafter, for ease of explanation, the value representing the second symbol is also referred to as the second symbol.

Details of DM Process

Figure 4:
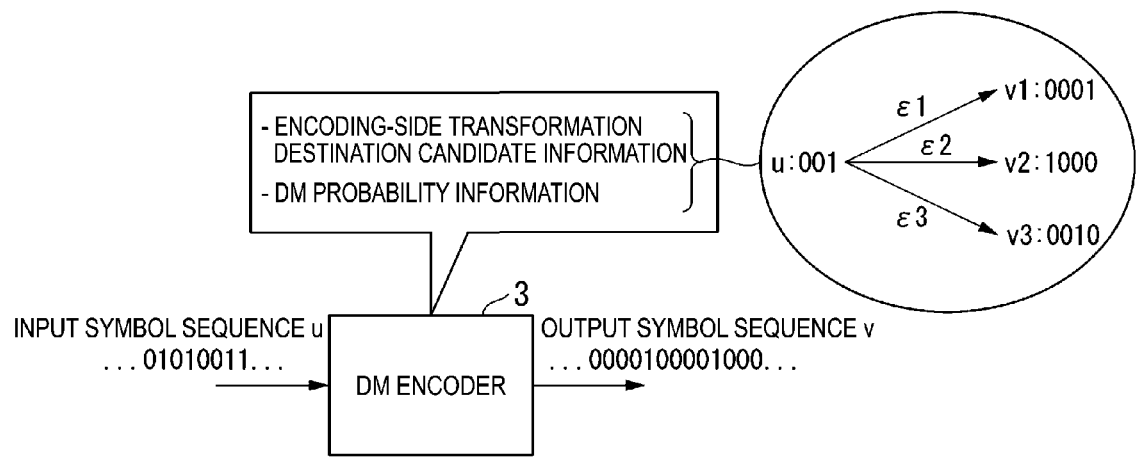
FIG. 4 is an explanatory diagram for explaining a DM process according to an embodiment.

The DM process is described in detail with reference to FIG. 4. FIG. 4 is an explanatory diagram for explaining the DM process according to an embodiment.

The DM process includes a DM transformation process and a DM probability acquiring process. The DM transformation process is a process for transforming the input symbol sequence u into the output symbol sequence v on the basis of the input symbol sequence u input to the DM encoder 3 and encoding-side transformation mapping $H_F$. The encoding-side transformation mapping $H_F$ is information including encoding-side transformation destination candidate information and DM probability information. The encoding-side transformation destination candidate information is information indicating candidates for the output symbol sequence v that is a transformation destination for the input symbol sequence u (hereinafter referred to as "transformation destination candidates"). For example, in FIG. 4, the encoding-side transformation destination candidate information indicates that the transformation destination candidates of a sequence (001) in the input symbol sequence u are the following three, i.e., (0001), (1000), and (0010). Note that in FIG. 4, the first symbol is 0 or 1, and the second symbol is 0 or 1.

The number of candidates for the output symbol sequence v that is the transformation destination for the input symbol sequence u may be one or plural. The encoding-side transformation destination candidate information may be expressed in any way so long as the information indicates the candidates for the output symbol sequence v that is the transformation destination for the input symbol sequence u.

The DM probability information is information indicating a DM probability ε. The DM probability ε is a probability with which the input symbol sequence u is transformed into a transformation destination candidate indicated by the encoding-side transformation mapping $H_F$, and is a probability for each set of the input symbol sequence u and each of the transformation destination candidates. In other words, the DM probability ε is a conditional probability with which, when the input symbol sequence u is input to the DM encoder 3, the input symbol sequence u input is transformed into the output symbol sequence v that is one of the transformation destination candidates.

For example, in a case that the encoding-side transformation mapping $H_F$ indicates that the transformation destination candidates from the input symbol sequence u are three sequences, i.e., an output symbol sequence v1, an output symbol sequence v2, and an output symbol sequence v3, the DM probability c indicates a first transformation probability, a second transformation probability, and a third transformation probability. The first transformation probability is a probability with which the input symbol sequence u is transformed into the output symbol sequence v1. The second transformation probability is a probability with which the input symbol sequence u is transformed into the output symbol sequence v2. The third transformation probability is a probability with which the input symbol sequence u is transformed into the output symbol sequence v3. The DM probability c indicates, for example, in the case of FIG. 4, that the first transformation probability is designated by ε1, the second transformation probability is designated by ε2, and the third transformation probability is designated by ε3.

The encoding-side transformation mapping $H_F$ may be, for example, a function with input of the input symbol sequence u and output of the candidates for the output symbol sequence v that is the transformation destination for the input symbol sequence u. However, any output symbol sequence v corresponds to any of u.

The DM probability acquiring process is a process for acquiring the DM probability information in accordance with the input symbol sequence u, the information indicating the second probability distribution, and a decoding-side transformation mapping $H_R$. The decoding-side transformation mapping $H_R$ is mapping from a transformation destination indicated by the encoding-side transformation destination candidate information to a transformation source indicated by the encoding-side transformation destination candidate information. Thus, a range of the encoding-side transformation mapping $H_F$ with the input symbol sequence u being given is an inverse image of the input symbol sequence u by the decoding-side transformation mapping $H_R$.

The DM probability acquiring process may be any process as long as it is a process for acquiring DM probability information in accordance with the input symbol sequence u, the information indicating the second probability distribution, and the decoding-side transformation mapping $H_R$. The information indicating the second probability distribution and the decoding-side transformation mapping $H_R$ are information stored in advance by the DM encoder 3. Note that the information stored by the DM encoder 3 specifically means that the information is stored by a storage unit included in the DM encoder 3 (a storage unit 22 described below).

For example, in a case that the DM encoder 3 already stores the DM probability information for each set of the input symbol sequence u, the information indicating the second probability distribution, and the decoding-side transformation mapping $H_R$, the DM probability acquiring process is a process for reading the DM probability information corresponding to the input symbol sequence u input.

The DM probability acquiring process may be, for example, a symbol probability acquiring process. The symbol probability acquiring process is a process for acquiring, for each data point in the output symbol sequence u, a probability of appearance of the second symbol that each data point may take, in accordance with the input symbol sequence u, the information indicating the second probability distribution, and the decoding-side transformation mapping $H_R$. More specifically, the symbol probability acquiring process is a process for acquiring a conditional probability with which, in a case that an input symbol sequence input to the DM encoder 3 is the input symbol sequence u, a value of each data point in the output symbol sequence is a value of each data point in the output symbol sequence v.

The method performed in the symbol probability acquiring process is, for example, a belief propagation (BP) algorithm. The symbol probability acquiring process may be, for example, a process described in Modification Example 3 that is described later.

The DM probability acquiring process may be, for example, a process for acquiring the DM probability information by performing a Markov chain Monte Carlo method.

In the DM process, first, the DM probability acquiring process is performed. In the DM process, next, the input symbol sequence u is transformed into the output symbol sequence v that is one of the transformation destination candidates indicated by the encoding-side transformation mapping $H_F$ with a probability corresponding to the DM probability c indicated by the acquired DM probability information.

Note that the input symbol sequence u and the output symbol sequence v according to the DM process satisfy a relationship of Expression (1) below.

[Math. 1]

$$|A_H|^k < |B_H|^n \qquad (1)$$

$a_m$ represents the first symbol. m represents an integer of 1 or more and M or less (M represents an integer of 2 or more). $A_H$ is a set having $a_1$ to $a_M$ as elements. That is, the number of elements of the set $A_H$ is M. When X represents a set, |X| represents the number of elements of a set X.

The meaning represented by Expression (1) will be described. In the communication system 100, there are a plurality of input symbol sequences u input to the DM encoder 3, depending on the content of the information desired to be sent by the sending person 991 to a receiving person 992. Therefore, the number of candidates for the input symbol sequence u input to the DM encoder 3 is plural.

Expression (1) represents a condition satisfied by the number of candidates for the input symbol sequence u that has k first symbols (i.e., the code length is k) (hereinafter, referred to as "k-input sequence candidates") among the candidates for the input symbol sequence u input to the DM encoder 3. More specifically, the right side of Expression (1) indicates the number of k-input sequence candidates in a case that the following first symbol number condition is satisfied. k represents an integer of 1 or more.

The first symbol number condition is a condition in which the content of information to be transmitted by the sending person 991 using the communication system 100 to the receiving person 992 is the content represented by the input symbol sequence u having k first symbols. The first symbol is, for example, a binary value bit.

The number of k-input sequence candidates in the case that the first symbol number condition is satisfied is (M^k). M^k means the k-th power of M.

$b_l$ represents the second symbol. l is an integer of 1 or more and L or less (L represents is an integer of 2 or more). $B_H$ is a set having elements of $b_l$ to $b_L$. In other words, the number of elements of the set $B_H$ is L. The left side of Expression (1) indicates the number of n-output sequence candidates.

The n-output sequence candidate is a candidate of a transformation destination obtained by the DM process on the input symbol sequence u having the code length of k, and is a candidate for the output symbol sequence v having n second symbols. In other words, the n-output sequence candidate is a transformation destination candidate of the k-input sequence candidate formed of a sequence of the second symbols having the code length of n. The number of n-output sequence candidates is (L^(n−k)) when the decoding-side transformation mapping $H_R$ is a linear mapping. L^(n−k) means the (n−k)-th power of L. n is an integer more than k.

In this manner, Expression (1) represents that the number of k-input sequence candidates in the case that the first symbol number condition is satisfied is less than the number of n-output sequence candidates.

Note that, in a case that the first probability distribution is an independent, identical, and uniform distribution, the DM probability c is expressed by Equation (3), based on the Bayes' theorem and Equation (2). P(X1|X2) represents a probability with which a value of a random variable conforming to a prescribed probability distribution is X1 when a condition X2 is satisfied. P(X3) represents a probability with which a value of a random variable conforming to a prescribed probability distribution is X3.

[Math. 2]
$$P(u_l) = \frac{1}{|A_H|^k} \quad (2)$$

[Math. 3]
$$\varepsilon = P(v|u) = |A_H|^k \delta(u = Hv) P(v) \quad (3)$$

In Equation (2), "l" is an identifier for distinguishing one candidate for the input symbol sequence u from another candidate for the input symbol sequence u. In Equation (3), δ is an indicator function, which outputs 1 when a condition is satisfied and 0 when the condition is not satisfied. P(v|u) in Equation (3) represents a conditional probability with which an output symbol sequence is the output symbol sequence v when an input symbol sequence input to the DM encoder 3 is the input symbol sequence u.

The detailed description of the DM process ends here, and the description returns to FIG. 1. The FEC encoder 4 gives a code (parity) for forward error correction to the output symbol sequence v. Hereinafter, the output symbol sequence given the parity is referred to as a sequence with parity.

The modulator 5 modulates a medium that conveys the information in a prescribed modulation scheme so as to satisfy a modulation condition. The modulation condition is a condition in which a modulated medium represents each second symbol and a code for forward error correction in the sequence with parity. The medium that conveys the information is, for example, light. The prescribed modulation scheme is, for example, amplitude modulation. Hereinafter, the medium modulated by the modulator 5 is referred to as a transmitted signal.

The communication path 6 transmits a transmitted signal. In other words, the communication path 6 is a transmission line. The communication path 6 is, for example, an optical fiber. The communication path 6 may be, for example, a high-frequency cable or a space in which a transmitted signal propagates. In such a case, the medium that conveys the information is a radio wave. The communication path may impart a noise to the transmitted signal. For example, a noise is an additive white Gaussian noise (AWGN).

The demodulator 7 demodulates the transmitted signal. The demodulator 7 generates a sequence with parity to which a noise generated by the communication path 6 due to the demodulation of the transmitted signal is imparted.

The FEC decoder 8 transforms the sequence with parity to which the noise is imparted, into a non-parity output symbol sequence. The non-parity output symbol sequence is a sequence in which the code for forward error correction is deleted from the sequence with parity. The non-parity output symbol sequence is the output symbol sequence v output by the DM encoder 3, and is the output symbol sequence v before the code is given by the FEC encoder 4.

The DM decoder 9 performs an inverse DM process on the output symbol sequence v. The DM decoder 9 performs the inverse DM process to transform the output symbol sequence v into the input symbol sequence u.

Details of Inverse DM Process

Figure 5:
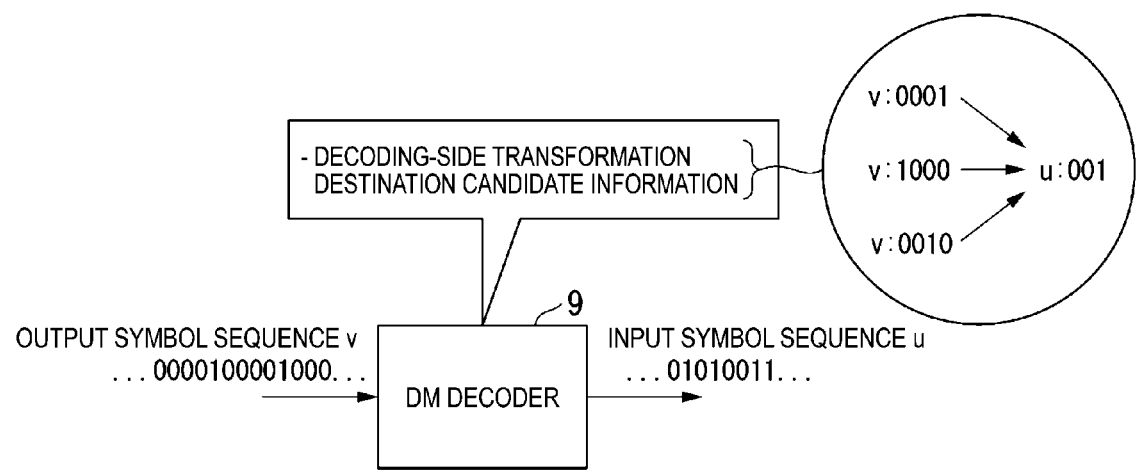
FIG. 5 is an explanatory diagram for explaining an inverse DM process according to an embodiment.

The inverse DM process is described in detail with reference to FIG. 5. FIG. 5 is an explanatory diagram for explaining the inverse DM process according to an embodiment. The inverse DM process is a process for transforming the output symbol sequence v into the input symbol sequence u by the decoding-side transformation mapping $H_R$. The decoding-side transformation mapping $H_R$ is information indicating the input symbol sequence u that is the transformation source obtained by the DM transformation process on the output symbol sequence v. More specifically, the decoding-side transformation mapping $H_R$ is a surjective mapping that transforms the output symbol sequence v into the input symbol sequence u associated by the encoding-side transformation mapping $H_F$. The decoding-side transformation mapping $H_R$ may be, for example, mapping represented by a mathematical expression.

For example, the decoding-side transformation mapping $H_R$ in FIG. 5 indicates that the input symbol sequence u that is a transformation destination for (0001) is (001). The decoding-side transformation mapping $H_R$ in FIG. 5 also indicates that the input symbol sequence u that is a transformation destination for (1001) is (001). Furthermore, the decoding-side transformation mapping $H_R$ in FIG. 5 also indicates that the input symbol sequence that is a transformation destination for (0010) is (001). Note that in FIG. 5, the first symbol is 0 or 1, and the second symbol is 0 or 1.

The decoding-side transformation mapping $H_R$, and the output symbol sequence v and the input symbol sequence u satisfy a relationship expressed by Equation (4) below.

[Math. 4]

$$u = H_R v \qquad (4)$$

Here, the relationship between the decoding-side transformation mapping $H_R$ and the encoding-side transformation mapping $H_F$ will be described. The encoding-side transformation mapping $H_F$ is information for generating the output symbol sequence v that satisfies equation (4) described above, which is expressed using the decoding-side transformation mapping $H_R$, in accordance with the input symbol sequence u. As such, the encoding-side transformation mapping $H_F$ can be said to be a function having the information indicating the inverse image of the decoding-side transformation mapping $H_R$ and the DM probability information with respect to one input symbol sequence u.

The symbol bit transformer 10 transforms the input symbol sequence u into a transmission content bit string.

The bit string output unit 11 acquires the transmission content bit string. The bit string output unit 11 outputs the content indicated by the transmission content bit string in a form possible to be acquired by the receiving person 992. The bit string output unit 11 is, for example, an information device equipped with a monitor, such as a personal computer, a smartphone, or a tablet. In such a case, the bit string output unit 11 displays the content indicated by the transmission content bit string on a screen.

Figure 6:
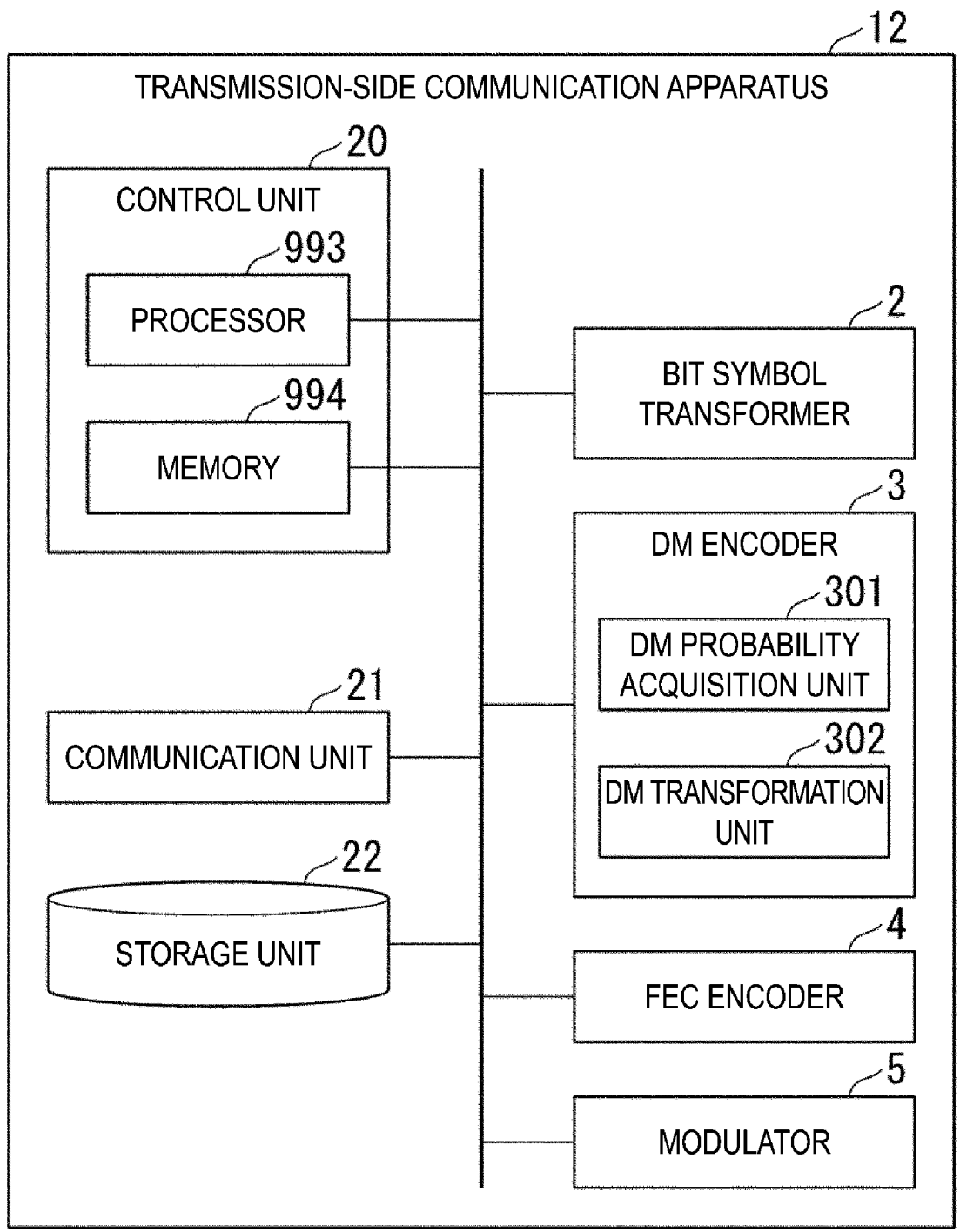
FIG. 6 is a diagram illustrating an example of a hardware configuration of a transmission-side communication apparatus 12 according to an embodiment.

FIG. 6 is a diagram illustrating an example of a hardware configuration of the transmission-side communication apparatus 12 according to an embodiment. The transmission-side communication apparatus 12 includes a control unit 20 including a processor 993 such as a central processing unit (CPU) and a memory 994 connected through a bus, and executes a program. The transmission-side communication apparatus 12 executes the program to function as an apparatus including the control unit 20, a communication unit 21, the storage unit 22, the bit symbol transformer 2, the DM encoder 3, the FEC encoder 4, and the modulator 5.

More specifically, the transmission-side communication apparatus 12 reads the program that is stored by the processor 993 in the storage unit 22, and stores the read program in the memory 994. The processor 993 executes the programs stored in the memory 994 such that the transmission-side communication apparatus 12 functions as the apparatus including the control unit 20, the communication unit 21, the storage unit 22, the bit symbol transformer 2, the DM encoder 3, the FEC encoder 4, and the modulator 5.

The control unit 20 controls the operation of each of the functional units included in the apparatus itself (transmission-side communication apparatus 12). The control unit 20 controls the operation of the DM encoder 3 to cause the DM encoder 3 to perform the DM process, for example. The control unit 20 controls the operation of the communication unit 21, for example. The control unit 20 controls the operation of the communication unit 21 to cause the communication unit 21 to acquire the input symbol sequence U, for example. The control unit 20 controls the operation of the communication unit 21 to cause the communication unit 21 to output the transmitted signal to the communication path 6, for example.

The communication unit 21 is configured to include a communication interface for connecting the transmission-side communication apparatus 12 to the communication path 6 and the bit string generator 1. The communication unit 21 acquires the transmission content bit string by communicating with the bit string generator 1. The communication unit 21 outputs the transmitted signal to the communication path 6.

The storage unit 22 is configured using a storage device such as a magnetic hard disk device or a semiconductor storage device. The storage unit 22 stores various types of information related to the transmission-side communication apparatus 12. The storage unit 22 stores in advance the program for controlling the operations of the communication unit 21, the storage unit 22, the bit symbol transformer 2, the DM encoder 3, the FEC encoder 4, and the modulator 5, for example. The storage unit 22 stores information indicating the second probability distribution, for example.

The storage unit 22 stores the decoding-side transformation mapping $H_R$ in advance, for example. The storage unit 22 stores the encoding-side transformation destination candidate information in advance, for example. The storage unit 22 stores in advance a program for acquiring the DM probability information in accordance with the input symbol sequence u (hereinafter referred to as a "DM probability information acquisition program"), for example.

Note that the encoding-side transformation destination candidate information, which is information indicating the inverse image of the decoding-side transformation mapping $H_R$ with respect to the one input symbol sequence u as described above, may be acquired by the control unit 20 in accordance with the decoding-side transformation mapping $H_R$. Therefore, the encoding-side transformation destination candidate information need not necessarily be stored in the storage unit 22 in advance. In this manner, the encoding-side transformation destination candidate information is information that can be acquired in accordance with the decoding-side transformation mapping $H_R$.

The DM encoder 3 includes a DM probability acquisition unit 301 and a DM transformation unit 302.

The DM probability acquisition unit 301 performs the DM probability acquiring process. Performing the DM probability acquiring process specifically means that the DM probability acquisition unit 301 executes the DM probability information acquisition program. The DM transformation unit 302 performs the DM transformation process.

Figure 7:
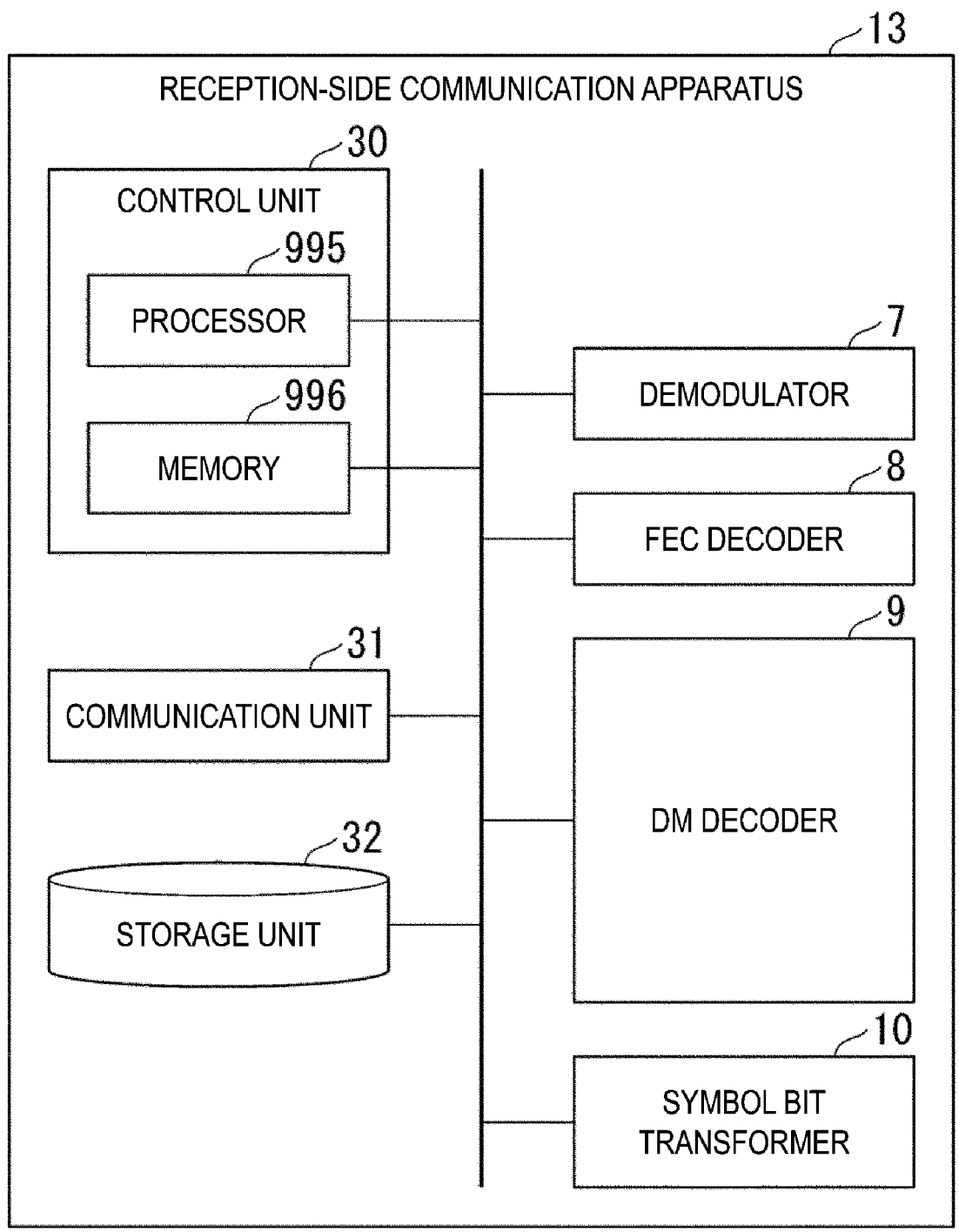
FIG. 7 is a diagram illustrating an example of a hardware configuration of a reception-side communication apparatus 13 according to an embodiment.

FIG. 7 is a diagram illustrating an example of a hardware configuration of the reception-side communication apparatus 13 according to an embodiment. The reception-side communication apparatus 13 includes a control unit 30 including a processor 995 such as a CPU and a memory 996 connected through a bus, and executes a program. The reception-side communication apparatus 13 executes the program to function as an apparatus including the control unit 30, a communication unit 31, a storage unit 32, the demodulator 7, the FEC decoder 8, the DM decoder 9, and the symbol bit transformer 10.

More specifically, the reception-side communication apparatus 13 reads the program that is stored by the processor 995 in the storage unit 32, and stores the read program in the memory 996. The processor 995 executes the program stored in the memory 996 such that the reception-side communication apparatus 13 functions as the apparatus including the control unit 30, the communication unit 31, the storage unit 32, the demodulator 7, the FEC decoder 8, the DM decoder 9, and the symbol bit transformer 10.

The control unit 30 controls the operation of each of the functional units included in the apparatus itself (reception-side communication apparatus 13). The control unit 30 controls the operation of the DM decoder 9 to cause the DM decoder 9 to perform the inverse DM process, for example. The control unit 30 controls the operation of the communication unit 31, for example. The control unit 30 controls the operation of the communication unit 31 to cause the communication unit 31 to receive the transmitted signal, for example. The control unit 20 controls the operation of the communication unit 31 to cause the communication unit 31 to output the transmission content bit string to the bit string output unit 11, for example.

The communication unit 31 is configured to include a communication interface for connecting the reception-side communication apparatus 13 to the communication path 6 and the bit string output unit 11. The communication unit 31 outputs, to the bit string output unit 11, the transmission content bit string by communicating with the bit string output unit 11. The communication unit 31 receives the transmitted signal propagating through the communication path 6.

The storage unit 32 is configured using a storage device such as a magnetic hard disk device or a semiconductor storage device. The storage unit 32 stores various types of information related to the reception-side communication apparatus 13. The storage unit 32 stores in advance a program for controlling the operation of the reception-side communication apparatus 13, for example. The storage unit 32 stores the decoding-side transformation mapping $H_R$ in advance, for example.

Figure 8:
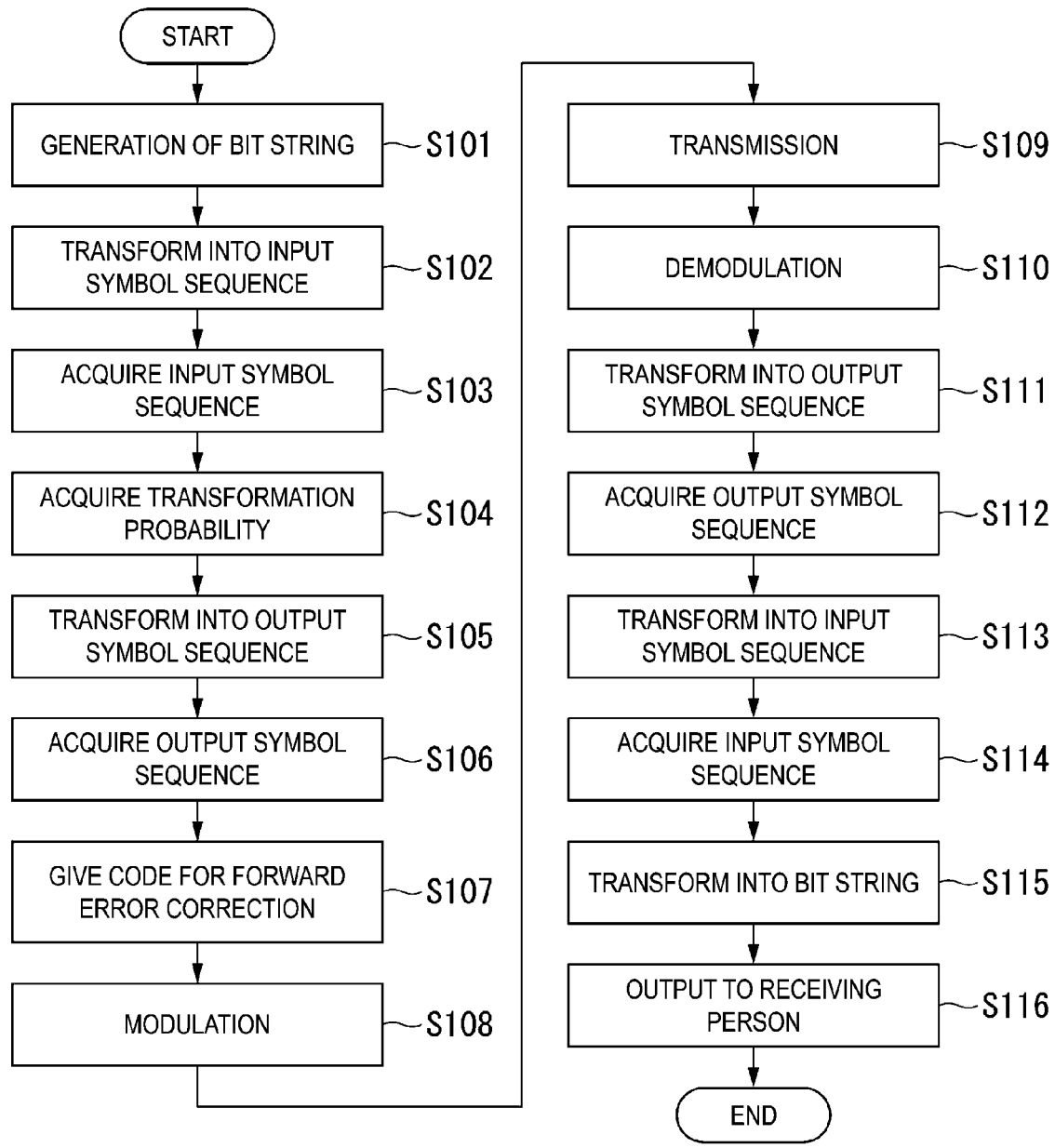
FIG. 8 is a flowchart illustrating an example of a flow of a process performed by the communication system 100 according to an embodiment.

FIG. 8 is a flowchart illustrating a flow of the process performed by the communication system 100 according to an embodiment.

The bit string generator 1 generates a transmission content bit string (step S101). Next, the bit symbol transformer 2 transforms the transmission content bit string into an input symbol sequence U (step S102). Next, the DM encoder 3 acquires the input symbol sequence u output by the bit symbol transformer 2 via the communication unit 21 (step S103). Next, the DM probability acquisition unit 301 performs the DM probability acquiring process by using the input symbol sequence u (step S104). The process in step S104 allows the DM probability information to be acquired. Next to step S104, the DM transformation unit 302 performs the DM transformation process on the input symbol sequence u in accordance with the encoding-side transformation mapping $H_F$ and the DM probability information (step S105). Next, the FEC encoder 4 acquires the output symbol sequence v (step S106).

Next, the FEC encoder 4 gives a parity to the output symbol sequence v (step S107). Next, the modulator 5 modulates a medium that conveys the information in a prescribed modulation scheme so as to satisfy a modulation condition, to generate a transmitted signal (step S108). Next, the communication path 6 transmits the transmitted signal (step S109). Next, the demodulator 7 demodulates the transmitted signal (step S110). Next, the FEC decoder 8 transforms the transmitted signal demodulated, into an output symbol sequence v^ (step S111). Specifically, in step S111, a forward error correction code is decoded.

Next, the DM decoder 9 acquires the output symbol sequence v^ of step S111 (step S112). Next, the DM decoder 9 performs the inverse DM process on the output symbol sequence v^ in accordance with the decoding-side transformation mapping $H_R$ (step S113). Next, the symbol bit transformer 10 acquires an input symbol sequence u^ generated by the inverse DM process (step S114). Next, the symbol bit transformer 10 transforms the input symbol sequence u^ into a transmission content bit string (step S115). Next, the bit string output unit 11 outputs the content indicated by the transmission content bit string in a form possible to be acquired by the receiving person 992 (step S116).

In FIG. 8, the processes in steps S104 and S105 correspond to the DM process.

Regarding Effect of Communication System 100

According to the information theory, the transmission capacity I(X|Y) is expressed by Equation (5) below.

[Math. 5]

$$I(X|Y)=H(X)-H(Y|X) \qquad (5)$$

In Equation (5), the first term of the right side represents the number of bits per symbol. The number of bits per symbol is a value that decreases as (n−k) bits increase. The (n−k) bits correspond to a value obtained by subtracting the code length of the input symbol sequence u from the code length of the output symbol sequence v. In Equation (5), the second term of the right side indicates a strength of the effect of the noise generated in the communication path 6 on the transmitted signal. The effect of the noise on the transmission capacity I(X|Y) is weaker as the distribution of the noise generated in the communication path 6 is closer to the distribution of the probability of appearance of each symbol of the signal input to the communication path 6.

The signal input to the communication path 6 is the transmitted signal, and the transmitted signal is a signal in which a code for forward error correction is given to the output symbol sequence v. Therefore, the probability of appearance of the symbol of the transmitted signal is the same as the probability of appearance of the symbols of the output symbol sequence v (i.e., the second probability distribution). Therefore, the effect of the noise on the transmission capacity I(X|Y) is weaker as the second probability distribution is closer to the distribution of the noise generated in the communication path 6.

Equation (5) indicates that the transmission capacity I(X|Y) increases if a decreasing amount of the first term of the right side is larger than a decreasing amount of the second term of the right side. As described above, the second term of the right side has a smaller value as the second probability distribution is closer to the distribution of the noise generated in the communication path 6. Thus, even if the number of bits per symbol is large, the transmission capacity is large when the second probability distribution is close to the distribution of the noise generated in the communication path 6.

Thus, the communication system 100 configured in this manner, which includes the DM code device 3 that changes the probability of appearance of the symbol of the signal input to the communication path 6, can increase the transmission capacity of the transmission line. For example, the distribution of noise generated when the communication path 6 is a long-distance optical transmission communication path can approximate a Gaussian distribution, and thus, the second probability distribution desirably substantially matches a Gaussian distribution.

First Modification Example

Note that in the case that the decoding-side transformation mapping $H_R$ is linear mapping, the DM probability acquiring process performed by the DM encoder 3 may be the symbol probability acquiring process. Hereinafter, in the case that an input symbol sequence input to the DM encoder 3 is the input symbol sequence u, a conditional probability with which an output symbol sequence is the output symbol sequence v is referred to as a primary transformation conditional probability.

Regarding Symbol Probability Acquiring Process

Here, the symbol probability acquiring process will be described in a specific example of the BP by using FIG. 9. In particular, the BP is described in an example in a case that the input symbol sequence u is a k-bit string, and the output symbol sequence v is an n-bit string. The BP is a process to perform a process for acquiring a secondary transformation conditional probability on each data point in the output symbol sequence v. The secondary transformation conditional probability is a conditional probability with which, in the case that an input symbol sequence input to the DM encoder 3 is the input symbol sequence u, a value of the j-th data point in the output symbol sequence v that is an output symbol sequence output by the DM encoder 3 is $v_j$. j represents a natural number of n or less.

Hereinafter, the BP is described using FIG. 9 in an example in a case of acquiring the secondary transformation conditional probability with which, in the case that an input symbol sequence input to the DM encoder 3 is the input symbol sequence u, a value of the j'-th data point in the output symbol sequence v that is an output symbol sequence output by the DM encoder 3 is $v_{j'}$. j' represents a natural number of n or less.

Figure 9:
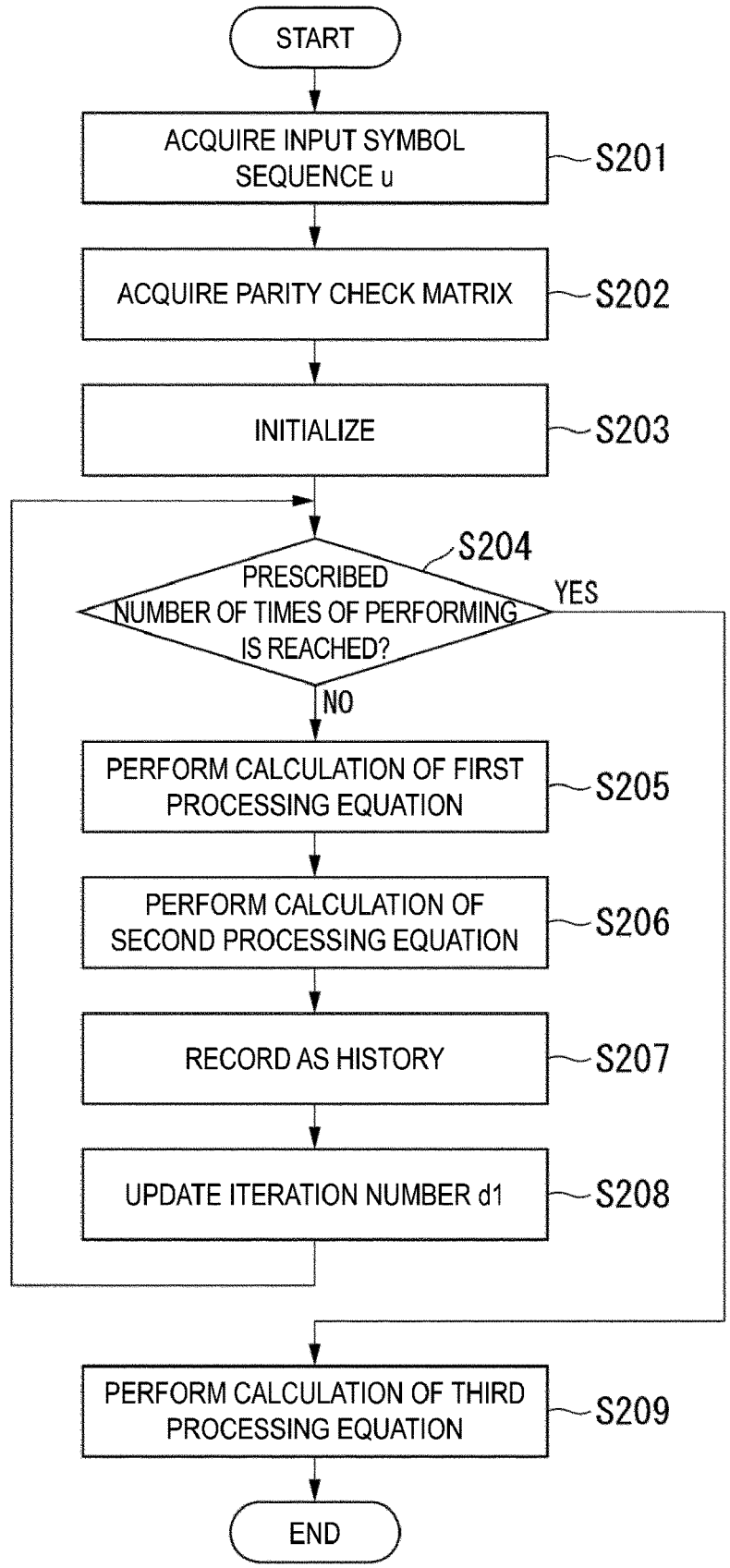
FIG. 9 is a flowchart illustrating a BP executed by a DM encoder 3 according to a first modification example.

FIG. 9 is a flowchart illustrating the BP executed by the DM encoder 3 in a first modification example. The DM encoder 3 acquires an input symbol sequence u (step S201). Next, the DM encoder 3 acquires a parity check matrix $H_p$ (step S202). The parity check matrix $H_p$ is a matrix in which a value of an element is one of 1 or 0, and is a k×n matrix expressed by Equation (6) below. In Equation (6), T is an orthogonal matrix. T^(−1) represents an inverse matrix of the orthogonal matrix T.

[Math. 6]

$$H_R = [H_P | T^{-1}] \quad (6)$$

In step S202, specifically, the DM encoder 3 first reads the decoding-side transformation mapping $H_R$ stored in the storage unit 22 in advance. In step S202, the DM encoder 3 then acquires the parity check matrix $H_p$ by using the read decoding-side transformation mapping $H_R$.

Next, the DM encoder 3 performs a first BP initialization process (step S203). The first BP initialization process is a process for initializing values of variables required to perform the BP.

The first BP initialization process specifically includes a process for setting a value indicating the number of times that a first secondary probability distribution sequence acquiring process is performed (hereinafter, referred to as a "first iteration number d1") to 1. d1 represents an integer of 1 or more and D1 or less. The first secondary distribution sequence acquiring process corresponds to processes in steps S205 and S206 described later. D1 represents a predefined value and is an upper limit value of the number of times of performing the first secondary distribution sequence acquiring process.

The first BP initialization process specifically includes a process for initializing a first secondary output probability distribution representing value $m1_{(g1, q1)}$ and a second secondary output probability distribution representing value $m2_{(q2, g2)}$.

The first secondary output probability distribution representing value $m1_{(g1, q1)}$ is a value distinguished by two values of an argument g1 and an argument q1 from another first secondary output probability distribution representing value $m1_{(g1, q1)}$. The first secondary output probability distribution representing value $m1_{(g1, q1)}$ is a variable in the first secondary distribution sequence acquiring process. Specifically, the first secondary output probability distribution representing value $m1_{(g1, q1)}$ is a variable associated with a non-zero element and is a first variable associated with a non-zero element having a row number of g1 and a column number of q1. The non-zero element is an element having a value of 1 of the elements of the parity check matrix $H_p$.

The second secondary output probability distribution representing value $m2_{(q2, g2)}$ is a value distinguished by two values, i.e., an argument q2 and an argument g2, from another second secondary output probability distribution representing value $m2_{(q2, g2)}$. The second secondary output probability distribution representing value $m2_{(q2, g2)}$ is a variable in the first secondary distribution sequence acquiring process. Specifically, the second secondary output probability distribution representing value $m2_{(q2, g2)}$ is a variable associated with a non-zero element and is a second variable associated with a non-zero element having a row number of g2 and a column number of q2.

g1 and g2 represent natural numbers of k or less, and q1 and q2 are natural numbers of n or less. In the BP, the number of non-zero elements is assumed to be Z, and up to Z first secondary output probability distribution representing values are used. In the BP, up to Z second secondary output probability distribution representing values are used.

The process for initializing the first secondary output probability distribution representing value is specifically a process for setting the values of all of the first secondary output probability distribution representing values to values indicating a predefined prescribed distribution in accordance with the parity check matrix $H_p$. The predefined prescribed distribution is, for example, a uniform distribution. Setting means that a value is determined and the determined value is recorded in the storage unit 22.

The process for initializing the second secondary output probability distribution representing value is specifically a process for setting all of the second secondary output probability distribution representing values in a predefined prescribed distribution in accordance with the parity check matrix $H_p$. The predefined prescribed distribution is, for example, a uniform distribution. Setting the second secondary output probability distribution representing value means that a second secondary output probability distribution representing value is obtained, and after the obtaining, the obtained value is recorded in the storage unit 22.

The first BP initialization process specifically includes a process for initializing a primary output probability distribution representing value $m_j$. The primary output probability distribution representing value $m_j$ is a value representing a probability distribution in which a value included in the j-th data point in the output symbol sequence v is a random variable. The primary output probability distribution representing value $m_j$ is, for example, a vector having two values of (E1, E2) in a case that each data point in the output symbol sequence v is either one of two values, 0 and 1. E1 indicates a probability with which the value of the data point is 0. E2 represents a probability with which the value of the data point is 1. The values of E1 and E2 represent a total of probabilities of 100%. The values of E1 and E2 of the primary output probability distribution representing value $m_j$ are not necessarily the same among all the primary output probability distribution representing values $m_j$.

A primary output probability distribution representing value $m_{j'}$ and the first secondary output probability distribution representing value (i.e., $m1_{(i,j')}$) with the argument g1 of i and the argument q1 of j' satisfy a relationship expressed by Equation (7) below. The value i indicates a column number of a non-zero element of a non-zero column set A(j'). The non-zero column set A(j') is a set having elements as column numbers i of the non-zero elements located on the j'-th row of the parity check matrix $H_p$. Thus, i represents a natural number of k or less.

[Math. 7]

$$m_{j'} = \prod_{i \in B(j')} m1_{(i,j')} \tag{7}$$

In equation (7), a product sign is a sign indicating to obtaining a product for each element. The product sign is a sign indicating a process for using two vectors having the same number of elements (hereinafter referred to as "product component vectors") to obtain one vector (hereinafter referred to as a "product vector"). The product vector is a vector having the t-th element that is a product of the t-th element of one of two product component vectors and the t-th element of the other product component vector (t is an integer of 1 or more). The product vector is represented by a representation expressed by Relationship (8) below. In Relationship (8), $O_s$ represents a product vector, and $a_1$ and $a_2$ represent product vectors. The number of elements of the product vector $a_1$ is the same as the number of elements of the product vector az. Note that the meaning of the product sign similarly applies to Equation (9) and subsequent equations.

[Math. 8]

$$\begin{cases} O_S \equiv \prod_{i=1,2} a_i = \begin{pmatrix} ac \\ \vdots \\ bd \end{pmatrix} \\ a_1 = \begin{pmatrix} a \\ \vdots \\ b \end{pmatrix} \\ a_2 = \begin{pmatrix} c \\ \vdots \\ d \end{pmatrix} \end{cases} \tag{8}$$

The initializing of the primary output probability distribution representing value is specifically a process for acquiring all the primary output probability distribution representing values in accordance with the parity check matrix $H_p$ by using Equation (7). The acquired primary output probability distribution representing value is recorded in the storage unit 22.

The first BP initialization process specifically includes a first auxiliary sequence initializing process. The first auxiliary sequence initializing process is a process for initializing a first auxiliary sequence S in accordance with the input symbol sequence u. The first auxiliary sequence S is a sequence of data points $s_i$, where the number of data points is the same as that of the input symbol sequence u. The data point $s_i$ is an auxiliary variable used in the symbol probability acquiring process, and is the i-th data point in the first auxiliary sequence S. Hereinafter, the data point $s_i$ is referred to as the first auxiliary variable $s_i$. Note that the first auxiliary sequence S is stored in the storage unit 22.

The first auxiliary sequence S is initialized by the first auxiliary sequence initializing process. In the initialization, the input symbol sequence u is substituted into the first auxiliary sequence S, for example. Hereinafter, the symbol probability acquiring process is described in one example in a case that the first auxiliary sequence S immediately after initialization is the same as the input symbol sequence u.

Next to step S203, the DM encoder 3 determines whether the number of times that the first secondary distribution sequence acquiring process is performed has reached a prescribed number (step S204). Specifically, the DM encoder 3 determines whether the first iteration number d1 is less than D1. In a case that d1 is less than D1, the DM encoder 3 determines that the number of times that the first secondary distribution sequence acquiring process is performed has not reached the prescribed number. In a case that d1 is D1, the DM encoder 3 determines that the number of times that the first secondary distribution sequence acquiring process is performed has reached the prescribed number.

In the case that the number of times that the first secondary probability distribution sequence acquiring process is performed has not reached the prescribed number (NO in step S204), the DM encoder 3 performs the first secondary probability distribution sequence acquiring process (step S205 and step S206). The first secondary probability distribution sequence acquiring process is a process for acquiring the first secondary output probability distribution representing value. The first secondary probability distribution sequence acquiring process will be described in order from the process in step S205.

Next to the process in step S204, the DM encoder 3 executes a first processing equation expressed by Equation (9) below for all values j (step S205).

[Math. 9]

$$m2_{(i,j)} = I_j \prod_{i' \in B(j) \backslash i} m1_{(i',j)} \tag{9}$$

A non-zero column set B(j) is a set having, as elements, row numbers r1 of non-zero elements located on the j-th column of the parity check matrix $H_p$. Thus, r1 represents a natural number of n or less.

A backslash in the first processing equation is a mathematical sign, and is a sign of mathematics meaning that when X is written on the right side of the backslash and Y is written on the left side of the backslash, Y is excluded from the elements belonging to the set X.

A coefficient $I_j$ in the first processing equation is a value expressed by Equation (10) below.

[Math. 10]

$$I_j = m_j \tag{10}$$

$m_j$ in Equation (10) is the primary output probability distribution representing value $m_{j'}$ recorded in the storage unit 22. That is, the coefficient $I_j$ is the primary output probability distribution representing value $m_j$ obtained by the process for initializing the primary output probability distribution representing value in step S203.

Next to step 205, the DM encoder 3 executes a second processing equation expressed by Equation (11) below for all i (step S206). i represents any one element of the elements (i.e., i) of the non-zero column set A(j). $m2_{(i,j')}$ in the second processing equation is the secondary output probability distribution representing value $m2_{(i,j')}$ obtained in step S205.

[Math. 11]

$$m1_{(i,j)} = \sum_{j' \in A(i) \setminus j} \left( \delta(C) \prod_{j' \in A(i) \setminus j} \overline{m2_{(i,j')}} \right) \quad (11)$$

In equation (11), a product sign represents a product for each element and a sum sign represents a sum for each element.

C in the second processing equation indicates a condition. $\delta(C)$ is a function that returns 1 when the condition C is satisfied and returns 0 when the condition C is not satisfied. The condition C is expressed by Equation (12) below. Note that the first auxiliary sequence S is stored in the storage unit 22.

[Math. 12]

$$\left( \sum_{j \in A(i)} v_j \right) = s_i \quad (12)$$

Equation (12) expresses a constraint caused by the i-th row of the parity check matrix $H_p$. vj in Equation (12) represents the j-th data point in the output symbol sequence v. Specifically, the constraint is that a condition expressed by Equation (13) below is satisfied.

[Math. 13]

$$\langle h_i \cdot v \rangle = s_i \quad (13)$$

$h_i$ in Equation (13) represents the i-th row of $H_p$. In equation (13), <X·Y> represents an inner product of a vector X and a vector Y.

Next to step S206, the DM encoder 3 records all the first secondary output probability distribution representing values acquired by the process in step S206 in the storage unit 22 (step S207). In step S207, the DM encoder 3 does not overwrite the first secondary output probability distribution representing value. The DM encoder 3 adds the first secondary output probability distribution representing value obtained in step S206 to a history of the first secondary output probability distribution representing values obtained in the past. Thus, the storage unit 22 stores the history of each of the first secondary output probability distribution representing values acquired by the first secondary probability distribution sequence acquiring process (hereinafter referred to as a "first secondary output probability distribution representing value history").

Next to step S207, the DM encoder 3 updates the first iteration number d1 (step S208). Specifically, the value of the first iteration number d1 is increased by one. Next to the process in step S208, the processing returns to step S204.

On the other hand, in the case that the number of times that the first secondary probability distribution sequence acquiring process is performed has reached the prescribed number in step S204 (YES in step S204), the DM encoder 3 executes a third processing equation (step S209). More specifically, the DM encoder 3 executes the third processing equation by using the first secondary output probability distribution representing value indicated by the first secondary output probability distribution representing value history. The third processing equation is an equation expressed by Equation (7) described above. The DM encoder 3 executes the third processing equation to acquire the primary output probability distribution representing value $m_j$. The primary output probability distribution representing value $m_j$ acquired by the DM encoder 3 is recorded in the storage unit 22. A set of the primary output probability distribution representing values $m_j$ is an example of the DM probability information.

In this manner, the DM encoder 3 performs a first primary output probability distribution acquiring process to update the primary output probability distribution representing value $m_j$. The first primary output probability distribution acquiring process is a process for acquiring the primary output probability distribution representing value $m_j$ in accordance with the information initialized in step S203. Specifically, the first primary output probability distribution acquiring process corresponds to the processes from step S204 to step S209 in FIG. 9.

In this manner, the BP is the process for acquiring the conditional probability corresponding to the input symbol sequence, where with the conditional probability, each data point in the output symbol sequence is transformed into the candidate of the transformation destination.

In obtaining the secondary transformation conditional probability for one data point in the output symbol sequence v, the BP does not need to use the information of another data point in the output symbol sequence v. As such, the DM encoder 3 using the BP can perform the coding process in parallel processing.

In addition, in the BP as expressed by Equation (9), arithmetic operations can be performed in parallel for each value i in arithmetic operations of the first processing equation. As such, the DM encoder 3 using the BP can perform the coding process in parallel processing.

Although the case that the DM encoder 3 performs the BP is described above as an example of the coding process, the DM encoder 3 has a similar effect when encoding is performed using the symbol probability acquiring process even in the case of a process other than the BP. In other words, the DM encoder 3 that acquires the primary transformation conditional probability, and uses the acquired primary transformation conditional probability to perform the coding can perform the coding process in parallel processing.

The communication system 100 of the first modification example configured in this manner performs coding by the symbol probability acquiring process. As a result, the communication system 100 of the first modification example can reduce the time required for communication.

Note that in a case that the DM encoder 3 acquires the output symbol sequence v by using the symbol probability acquiring process and the decoding-side transformation mapping $H_R$ is a sparse matrix, an arithmetic operation amount required for the DM probability acquiring process is reduced compared to a case that the decoding-side transformation mapping $H_R$ is not a sparse matrix. Specifically, in the case of a sparse matrix, the number of elements of A(i) or B(j) in Equation (10) or (11) decreases, so the arithmetic operations of the product and the sum are reduced.

Second Modification Example

In the case that the decoding-side transformation mapping $H_R$ is a linear mapping, in the DM process using the symbol probability acquiring process such as the BP, part of the information contained in the input symbol sequence u may be lost during the transformation of the input symbol sequence u by performing the symbol probability acquiring process. This is because the symbol probability acquiring process such as the BP is an approximation algorithm. For example, in the case that the decoding-side transformation mapping $H_R$ is a linear mapping such as a sparse matrix, part of the information contained in the input symbol sequence u may be lost. The communication by the communication system 100 may not be impaired due to a small amount of the information lost, or the communication by the communication system 100 may be impaired.

In either case, a difference in the information between the output symbol sequence v and the input symbol sequence u can be reduced or reliably eliminated by performing a first type variation DM process described later to supplement the lost information. The lost information is information lost by performing the symbol probability acquiring process. As a result, even in the case that the communication by the communication system 100 is impaired, communication not impaired by the communication system 100 is enabled.

In the case that the decoding-side transformation mapping $H_R$ is a linear mapping, the DM encoder 3 may perform the first type variation DM process in one example of the DM process. The first type variation DM process is a process in which a first intermediate output symbol sequence acquiring process is repeated a prescribed number of times, and thereafter, the output symbol sequence v is acquired in accordance with a history of acquired intermediate output symbol sequences. The first intermediate output symbol sequence acquiring process is a process for acquiring an intermediate output symbol sequence by using the symbol probability acquiring process. Details of the first intermediate output symbol sequence acquiring process will be described in the description of FIG. 10, which will be described later.

The intermediate output symbol sequence has the number of data points similar to that of the output symbol sequence v. In other words, in a case that the output symbol sequence v is a sequence of n data points, the intermediate output symbol sequence is also a string of n data points. Hereinafter, the w-th data point in the intermediate output symbol sequence is represented by $(\hat{v})_w$. w represents a natural number of n or less. The data point $(\hat{v})_w$ is a maximum appearance probability value in the probability distribution that is acquired by the symbol probability acquiring process and is represented by the primary output probability distribution representing value $m_w$.

The maximum appearance probability value is a value of the probability variable appearing with the largest probability of the probabilities indicated by the probability distribution. For example, in a case that the probability distribution represented by the primary output probability distribution representing value $m_w$ is a probability distribution representing that 0 appears with a probability of 40% and 1 appears with a probability of 60%, the maximum appearance probability value is 1.

Figure 10:
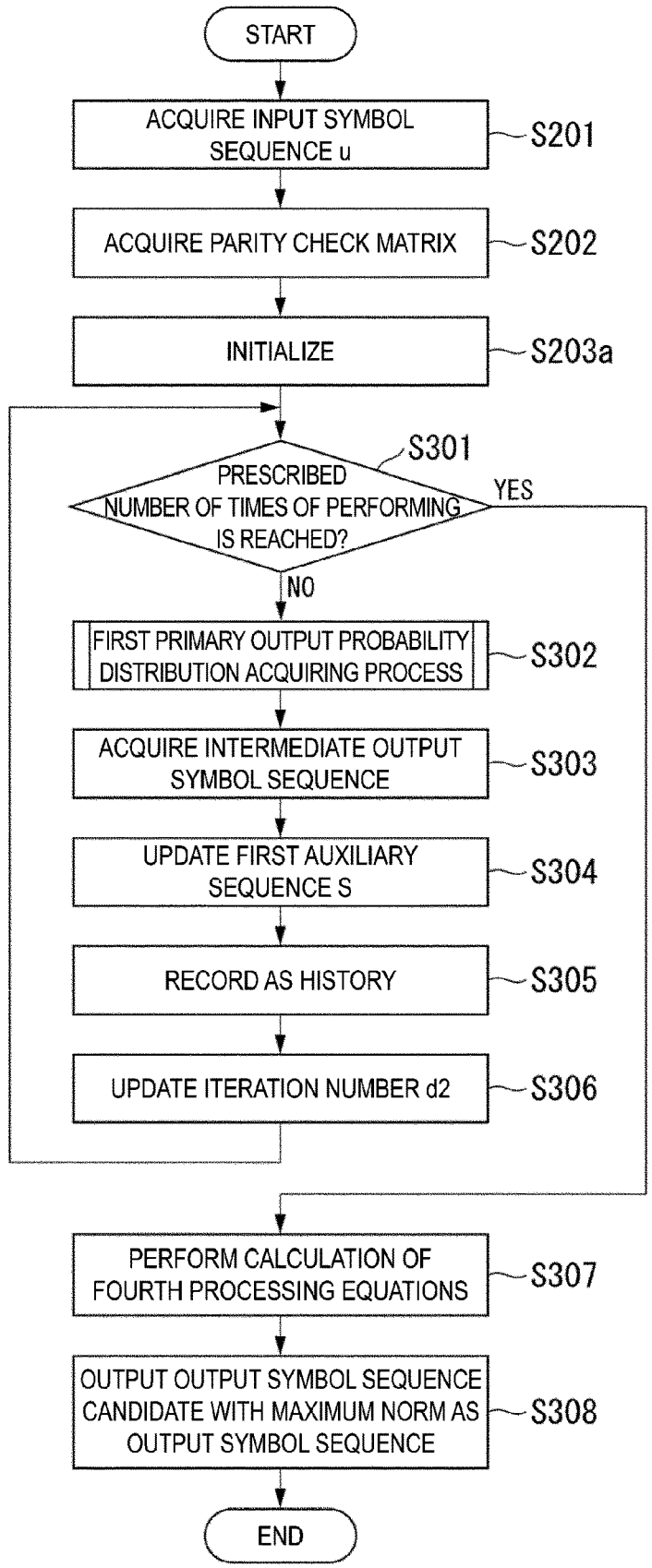
FIG. 10 is a flowchart illustrating an example of a flow of a first type variation DM process performed by the DM encoder 3 according to a second modification example.

FIG. 10 is a flowchart illustrating an example of a flow of the first type variation DM process performed by the DM encoder 3 according to a second modification example. Hereinafter, processes similar to those illustrated in FIG. 9 are denoted by the reference signs the same as those in FIG. 9, and description thereof will be omitted.

Note that in the first type variation DM process, the symbol probability acquiring process is performed until an end condition is satisfied. In the symbol probability acquiring process in the first type variation DM process, an initial value of the auxiliary sequence S is the same as that of the input symbol sequence u.

Next to step S202, the DM encoder 3 performs a second BP initialization process (step S203a). The second BP initialization process further includes performing an intermediate output symbol sequence initialization process and a second iteration number initialization process, in addition to performing the first BP initialization process.

The intermediate output symbol sequence initialization process is a process for initializing the intermediate output symbol sequence. The initializing of the intermediate output symbol sequence is a process for setting the value of each data point in the intermediate output symbol sequence to a predefined prescribed value. The predefined prescribed value is, for example, zero.

The second iteration number initialization process includes a process for setting a value indicating the number of times that the first primary output probability distribution acquiring process is performed (hereinafter, referred to as a "second iteration number d2") to 1. d2 represents an integer of 1 or greater and D2 or less. D2 represents a predefined value and is an upper limit value of the number of times that the first primary output probability distribution acquiring process is performed.

Next to step S203a, the DM encoder 3 determines whether the number of times that the first primary output probability distribution acquiring process is performed has reached a prescribed number (step S301). Specifically, the DM encoder 3 determines whether the second iteration number d2 is less than D2. In a case that d2 is less than D2, the DM encoder 3 determines that the number of times that the first primary output probability distribution acquiring process is performed has not reached the prescribed number. In a case that d2 is D2, the DM encoder 3 determines that the number of times that the first primary output probability distribution acquiring process is performed has reached the prescribed number.

In the case that the number of times that the first primary output probability distribution acquiring process is performed has not reached the prescribed number (NO in step S301), the DM encoder 3 performs the first primary output probability distribution acquiring process (that is, step S204 to step S209) (step S302). The DM encoder 3 performs the first primary output probability distribution acquiring process to acquire a primary output probability distribution representing value. The DM encoder 3 overwrites the value of the primary output probability distribution representing value stored in the storage unit 22 by use of the acquired primary output probability distribution representing value. In other words, the DM encoder 3 performs the first primary output probability distribution acquiring process to update the primary output probability distribution representing value.

Next to step S302, the DM encoder 3 performs the first intermediate output symbol sequence acquiring process by using the primary output probability distribution representing value acquired in step S302 (step S303). The DM encoder 3 performs the first intermediate output symbol sequence acquiring process to acquire an intermediate output symbol sequence.

In the first intermediate output symbol sequence acquiring processing, the DM encoder 3 specifically performs an intermediate output symbol sequence acquiring secondary process on each data point in the intermediate output symbol sequence to acquire the intermediate output symbol sequence. The intermediate output symbol sequence acquiring secondary process is a process for acquiring, as a value of the w-th data point $(\hat{v})_w$ in the intermediate output symbol sequence, the maximum appearance probability value in the probability distribution represented by the primary output probability distribution representing value $m_w$ acquired in step S302.

Next to step S303, the DM encoder 3 performs a first auxiliary sequence update process (step S304). The first auxiliary sequence update process is a process for updating the first auxiliary sequence S.

Specifically, the first auxiliary sequence update process is a process for acquiring, as a new first auxiliary sequence S, a value obtained by adding the first auxiliary sequence S to the product of the matrix of the parity check matrix and the intermediate output symbol sequence acquired in step S302. In the product of the matrix of the parity check matrix and the intermediate output symbol sequence acquired in step S302, the parity check matrix is multiplied by the intermediate output symbol sequence from the left.

Next to step S304, the DM encoder 3 adds the intermediate output symbol sequence acquired in step S303 to the history of the intermediate output symbol sequences acquired in the past (step S305). As such, the storage unit 22 stores a history of the intermediate output symbol sequences (hereinafter, referred to as an "intermediate output symbol sequence history").

Next to step S305, the DM encoder 3 updates the second iteration number d2 (step S306). Specifically, the value of the second iteration number d2 is increased by one. Next to the process in step S306, the processing returns to step S301.

On the other hand, in the case that the number of times that the first primary output probability distribution acquiring process is performed has reached the prescribed number in step S301 (YES in step S301), the DM encoder 3 acquires D2 output symbol sequence candidates (step S307). More specifically, the DM encoder 3 uses the intermediate output symbol sequence history and fourth processing equations to acquire D2 output symbol sequence candidates. The output symbol sequence candidate is a candidate for a sequence of the data points which is output as the output symbol sequence v by the DM encoder 3. The fourth processing equations are equations expressed by equations and Expressions (14) to (21) below.

[Math. 14]
$$v'^2 = h1 \oplus H2 \tag{14}$$

[Math. 15]
$$h1 = \left( \sum_{1 \le d2' \le r2} \hat{v}^{d2'} \right) \tag{15}$$

[Math. 16]
$$H2 = \left\{ \begin{array}{c} 0^{n-k} \\ T^{-1}H3 \end{array} \right\} \tag{16}$$

[Math. 17]
$$H3 = \{H4 \oplus s\} \tag{17}$$

[Math. 18]
$$H4 = H_R \left( \sum_{1 \le d2' \le r2} \hat{v}^{d2'} \right) \tag{18}$$

[Math. 19]
$$\hat{v}^{d2'} \equiv (v^\wedge)^\wedge d2' \tag{19}$$

[Math. 20]
$$v'^2 \equiv (v)^\wedge r2 \tag{20}$$

[Math. 21]
$$0^{n-k} \equiv 0^\wedge (n-k) \tag{21}$$

In the fourth processing equations, d2' represents a value of 1 or more and d2 or less. In the fourth processing equations, $(v^\wedge)^\wedge d2'$ represents an intermediate output symbol sequence acquired by the first intermediate output symbol sequence acquiring process with the second iteration number d2=d2'. In the fourth processing equations, $(v)^\wedge r2$ represents the r2-th intermediate output symbol sequence among D2 output symbol sequence candidates. D2 output symbol sequence candidates are acquired by the DM encoder 3 b using the intermediate output symbol sequence history and the fourth processing equations. r2 represents an integer of 1 or more and D2 or less. In the fourth processing equations, $0^\wedge(n-k)$ represents the zero matrix of n rows×k columns.

h1 represents a bit string of n bits. h1 represents a sequence of data points of a sum of the intermediate output symbol sequences acquired in the first intermediate output symbol sequence acquiring process performed r2 times from the first intermediate output symbol sequence acquiring process with d2 being 1 to the first intermediate output symbol sequence acquiring process with d2 being r2.

The sum of the intermediate output symbol sequences means a sum of base N numbers for respective data points where each data point in the output symbol sequence candidate is a N value bit. N is an integer of 2 or more. N is, for example, 2. In other words, the value of the w-th data point in the output symbol sequence represented by h1 is a value of a sum of base N numbers of the w-th data points in the intermediate output symbol sequences acquired in the respective first intermediate output symbol sequence acquiring process performed r2 times. Hereinafter, the sequence of the data points represented by h1 is referred to as an average output symbol sequence candidate.

H4 represents a sequence of data points where the decoding-side transformation mapping $H_R$ acts on the bit string represented by h1.

H3 represents acquiring an exclusive OR of the data point sequence represented by H4 and the input symbol sequence u. Hereinafter, a sequence of data points represented by an exclusive OR of the data point sequence represented by H4 and the input symbol sequence u is referred to as an input differential sequence. The input differential sequence is a sequence of data points representing differences between a sequence of data points obtained by decoding the average output symbol sequence and the input symbol sequence.

H2 represents transforming a representation of the input differential sequence so that the lost information can be added to information represented by the average output symbol sequence candidates.

The r2-th intermediate output symbol sequence $(v)^\wedge r2$ is a sequence of data points representing the information represented by the average output symbol sequence candidates to which the lost information is added, in the expression format the same as that of the output symbol sequence. Specifically, the sequence of data points in the expression format the same as the output symbol sequence means an N value n-bit string where the output symbol sequence is an N value n-bit string.

Next to step S307, the DM encoder 3 outputs an output symbol sequence candidate with a maximum norm among D2 output symbol sequence candidates acquired in step S307 (step S308).

The communication system 100 according to the second modification example configured in this manner supplements the output symbol sequence by feeding back the sequence indicating the lost information. As a result, the difference in the information between the output symbol sequence v and the input symbol sequence u can be reduced. Thus, the communication system 100 configured in this manner can reliably eliminate the difference in the information between the output symbol sequence v and the input symbol sequence u even in the case that the decoding-side transformation mapping $H_R$ is a linear mapping such as a sparse matrix, for example.

Note that the process for feeding back the lost information is specifically the process in step S304. The first auxiliary sequence S is a sequence in which the difference between the generated output symbol sequence and the input symbol sequence is added to the input symbol sequence in accordance with the probability acquired by the symbol probability acquiring process. Accordingly, the first auxiliary sequence S is an example of the sequence indicating the lost information. The process in step S302 is an example of the processing in which the symbol probability acquiring process is performed. Note that the condition that the prescribed number of times of performing is reached in step S301 is an example of the end condition.

Third Modification Example

In the case that the decoding-side transformation mapping $H_R$ is a linear mapping, in the DM process using the symbol probability acquiring process such as the BP, part of the information contained in the input symbol sequence u may be lost during the transformation of the input symbol sequence u by performing the symbol probability acquiring process. This is because the symbol probability acquiring process such as the BP is an approximation algorithm. For example, in the case that the decoding-side transformation mapping $H_R$ is a linear mapping such as a sparse matrix, part of the information contained in the input symbol sequence u may be lost. The communication by the communication system 100 may not be impaired due to a small amount of the information lost, or the communication by the communication system 100 may be impaired.

In either case, a difference in the information between the output symbol sequence v and the input symbol sequence u can be reduced or reliably eliminated by performing a second type variation DM process described later to supplement the lost information. As a result, even in the case that the communication by the communication system 100 is impaired, a communication not impaired by the communication system 100 is enabled.

In the case that the decoding-side transformation mapping $H_R$ is a linear mapping, the DM encoder 3 may perform the second type variation DM process in one example of the DM process. The second type variation DM process is a process in which a second intermediate output symbol sequence acquiring process, which is a process for acquiring an intermediate output symbol sequence, is repeated a prescribed number of times, and thereafter, the output symbol sequence v is acquired in accordance with a history of acquired intermediate output symbol sequences. Details of the second intermediate output symbol sequence acquiring process will be described in the description of FIG. 11, which will be described later.

Figure 11:
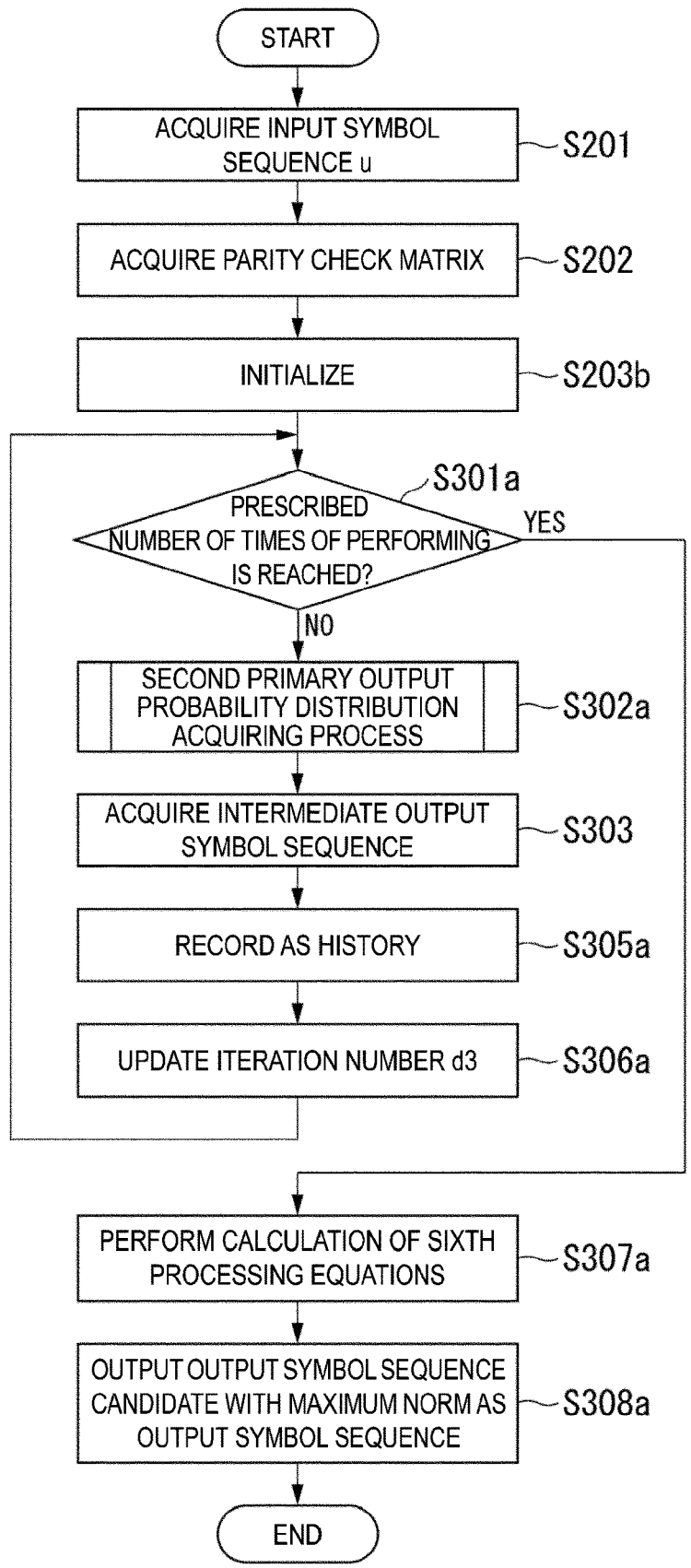
FIG. 11 is a flowchart illustrating an example of a flow of a second type variation DM process performed by the DM encoder 3 according to a third modification example.

FIG. 11 is a flowchart illustrating an example of a flow of the second type variation DM process performed by the DM encoder 3 according to a third modification example. Hereinafter, processes similar to those illustrated in FIG. 9 or 10 are denoted by the reference signs the same as those in FIG. 9 or 10, and description thereof will be omitted.

Next to step S202, the DM encoder 3 performs a third BP initialization process (step S203b). The third BP initialization process further includes performing the intermediate output symbol sequence initialization process and a third iteration number initialization process, in addition to performing the first BP initialization process.

The third iteration number initialization process includes a process for setting a value indicating the number of times that the second primary output probability distribution acquiring process is performed (hereinafter, referred to as a "third iteration number d3") to 1. d3 represents an integer of 1 or more and D3 or less. D3 represents a predefined value and is an upper limit value of the number of times that the second primary output probability distribution acquiring process is performed. The second primary output probability distribution acquiring process is a process for acquiring the primary output probability distribution representing value $m_j$, in which part of the first primary output probability distribution acquiring process is changed. Details of the second primary output probability distribution acquiring process will be described later.

Next to step S203b, the DM encoder 3 determines whether the number of times that the second primary output probability distribution acquiring process is performed has reached a prescribed number (step S301a). Specifically, the DM encoder 3 determines whether the third iteration number d3 is less than D3. In a case that d3 is less than D3, the DM encoder 3 determines that the number of times that the second primary output probability distribution acquiring process is performed has not reached the prescribed number. In a case that d3 is D3, the DM encoder 3 determines that the number of times that the second primary output probability distribution acquiring process is performed has reached the prescribed number.

In the case that the number of times that the second primary output probability distribution acquiring process is performed has not reached the prescribed number (NO in step S301a), the DM encoder 3 performs the second primary output probability distribution acquiring process (step S302a). The DM encoder 3 performs the second primary output probability distribution acquiring process to acquire a primary output probability distribution representing value. The DM encoder 3 overwrites the value of the primary output probability distribution representing value stored in the storage unit 22 by use of the acquired primary output probability distribution representing value. In other words, the DM encoder 3 performs the first primary output probability distribution acquiring process to update the primary output probability distribution representing value. Here, the details of the second primary output probability distribution acquiring process will be described with reference to FIG. 12.

Figure 12:
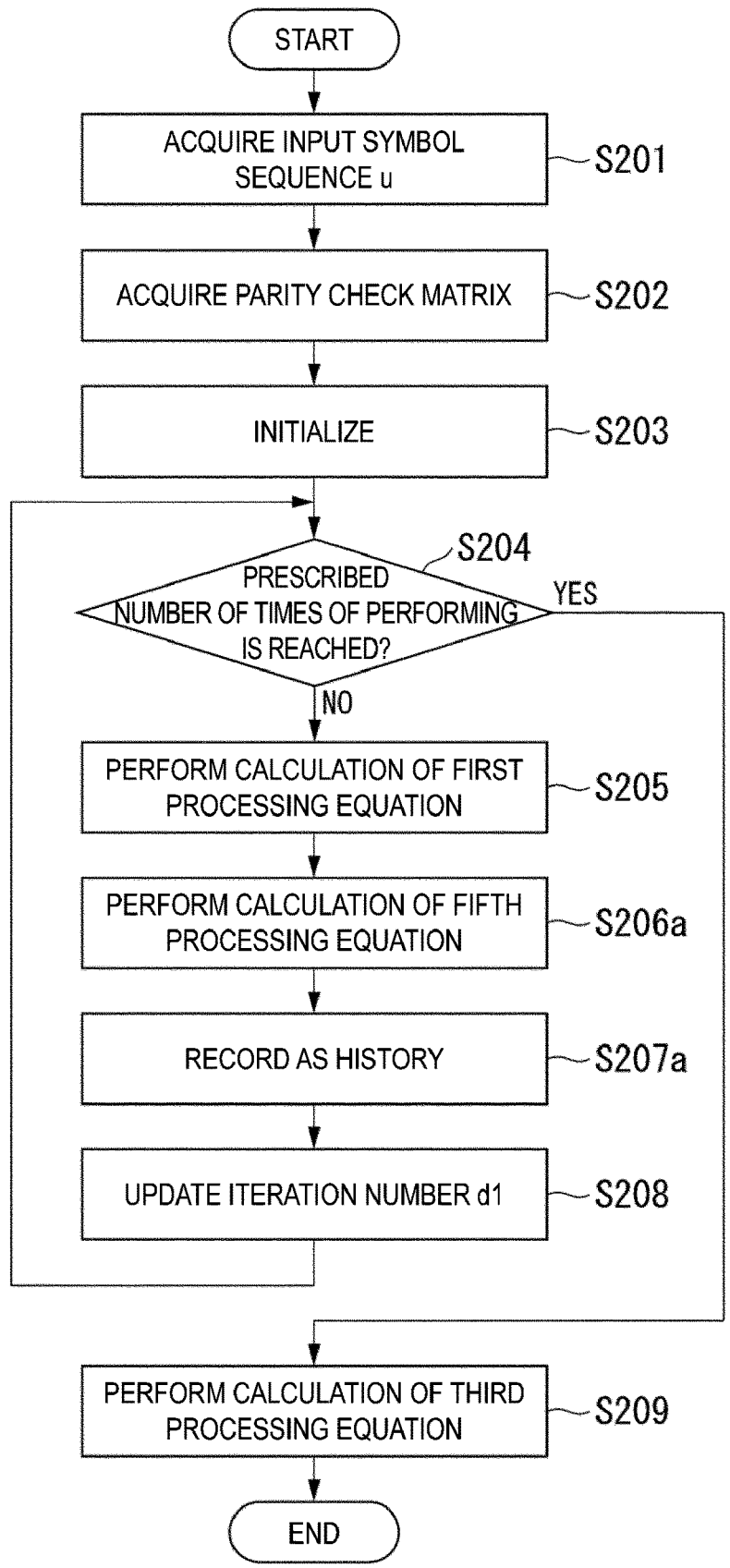
FIG. 12 is a flowchart illustrating an example of a flow of a second primary output probability distribution acquiring process according to a third modification example.

FIG. 12 is a flowchart illustrating an example of a flow of the second primary output probability distribution acquiring process in the third modification example. Processes similar to those illustrated in FIG. 9 are denoted by the reference signs the same as those in FIG. 9, and description thereof will be omitted. The second primary output probability distribution acquiring process differs from the first primary output probability distribution acquiring process in that sixth processing equations are executed instead of the second processing equation.

Next to step S205, the DM encoder 3 executes a fifth processing equation expressed by Equation (22) below for all i (step S206a). i represents any one element of the elements (i.e., i) of the non-zero column set A(j). $m2_{(i,\,j')}$ in the second processing equation is the secondary output probability distribution representing value $m2_{(i,\,j')}$ obtained in step S205.

[Math. 22]
$$m1_{(i,j)} = \sum_{j' \in A(i) \setminus j} \left( \delta(\overline{C'}) \prod_{j' \in A(i) \setminus j} \overline{m2_{(i,j')} f_{(i,j')}} \right) \quad (22)$$

In Equation (22), a product sign represents a product for each element and a sum sign represents a sum for each element. A condition C' in Equation (22) is expressed by Equation (23) below.

[Math. 23]
$$\left( \sum_{j \in A(i)} v_j \oplus F_j = S_i^{d3} \right) \quad (23)$$

$F_j$ in Equation (23) represents a binary bit. $f_{(i,j')}$ in Equation (22) represents an auxiliary variable different from the first auxiliary variable $s_i$ for the first auxiliary sequence S. Hereinafter, the auxiliary variable $f_{(i,j')}$ is referred to as a second auxiliary sequence. A value of the second auxiliary variable $f_{(i,j')}$ is a real number. An initial value of the second auxiliary variable $f_{(i,j')}$ is a randomly determined value of 1 or 0. The second auxiliary variable $f_{(i,j')}$ is updated to satisfy Equation (22) every time the process in step S206a is performed after step S206a is performed for the first time. The right side of Equation (23) means the first auxiliary variable $s_i$ in the case that the third iteration number is d3.

For a value of $F_j$, Equation (23) is calculated for a case that $F_j$ is 0 and a case that $F_j$ is 1, and $F_j$ satisfying $\delta(C)=1$ is determined as the value of F.

Next to step S206a, the DM encoder 3 performs a process in step S207a. The process in step S207a also includes a process in which the DM encoder 3 records the value of the second auxiliary variable $f_{(i,\,j')}$ in the storage unit 22 in addition to the process performed in step S207.

Next to step S207a, the DM encoder 3 performs the process in step S208. A series of the processes from step S204 through step S205, step S206a, step S207a, and step S208 until step S209 is performed corresponds to the second primary output probability distribution acquiring process. Hereinabove, the description of the second primary output probability distribution acquiring process is ended.

The description returns to FIG. 11. Next to step S302a, the DM encoder 3 performs the process in step S303. Next to step S303, the DM encoder 3 adds the intermediate output symbol sequence acquired in step S303 to the history of the intermediate output symbol sequences acquired in the past (step S305a). As such, the storage unit 22 stores, referred to as an "intermediate output symbol sequence history").

Next to step S305a, the DM encoder 3 updates the third iteration number d3 (step S306a). Specifically, the value of the third iteration number d2 is increased by one. Next to the process in step S306a, the processing returns to step S301a.

On the other hand, in the case that the number of times that the second primary probability output distribution acquiring process is performed has reached the prescribed number in step S301a (YES in step S301a), the DM encoder 3 acquires D3 output symbol sequence candidates (step S307a). More specifically, the DM encoder 3 uses the intermediate output symbol sequence history and the sixth processing equations to acquire D3 output symbol sequence candidates. The sixth processing equations are the equations in which d2, d2', and r2 in the fourth processing equations are changed to d3, d3', and r3, respectively. d3' represents a value of 1 or greater and d3 or less. r3 represents an integer of 1 or greater and D3 or less.

The sixth processing equations are equations expressed by Equations (24) to (31) below.

[Math. 24]
$$v'^3 = h1' \oplus H2' \quad (24)$$

[Math. 25]
$$h1' = \left( \sum_{1 \le d3' \le r3} \hat{v}^{d3'} \right) \quad (25)$$

[Math. 26]
$$H2' = \left\{ \begin{array}{c} 0^{n-k} \\ T^{-1} H3' \end{array} \right\} \quad (26)$$

[Math. 27]
$$H3' = \{H4' \oplus u\} \quad (27)$$

[Math. 28]
$$H4' = H_R \left( \sum_{1 \le d3' \le r3} \hat{v}^{d3'} \right) \quad (28)$$

[Math. 29]
$$\hat{v}^{d3'} \equiv (v^\wedge)^\wedge d3' \quad (29)$$

[Math. 30]
$$v'^2 \equiv (v)^\wedge r3 \quad (30)$$

[Math. 31]
$$0^{n-k} \equiv 0^\wedge (n-k) \quad (31)$$

In the sixth processing equations, $(v^\wedge)^\wedge d3'$ represents an intermediate output symbol sequence acquired by the second intermediate output symbol sequence acquiring process with the third iteration number d3=d3'. In the sixth processing equations, $(v)^\wedge r3$ represents the r3-th intermediate output symbol sequence among D3 output symbol sequence candidates acquired by the DM encoder 3 using the intermediate output symbol sequence history and the sixth processing equations. In the sixth processing equations, $0^\wedge(n-k)$ represents the zero matrix of n rows×k columns.

Next to step S307a, the DM encoder 3 outputs an output symbol sequence candidate with a maximum norm among D3 output symbol sequence candidates acquired in step S307a (step S308a).

The communication system 100 according to the third modification example configured in this manner feeds back the probability with which each candidate represents the lost information with respect to the candidate for the sequence representing the lost information. The communication system 100 according to the third modification example can supplement the output symbol sequence by such feedback, so the difference in the information between the output symbol sequence v and the input symbol sequence u can be reduced. Thus, the communication system 100 configured in this manner can reliably eliminate the difference in the information between the output symbol sequence v and the input symbol sequence u even in the case that the decoding-side transformation mapping $H_R$ is a linear mapping such as a sparse matrix, for example.

Note that the process for feeding back the lost information is specifically the process in step S206a. Note that the second auxiliary variable $f_{(i,j')}$ is an example of the probability with which each candidate represents the lost information with respect to the candidate for the sequence representing the lost information. The process in step S302a is an example of the processing in which the symbol probability acquiring process is performed. Note that the condition that the prescribe number of times of performing is reached in step S204 is an example of the end condition.

Fourth Modification Example

Note that the communication system 100 does not necessarily include only one DM encoder 3. The communication system 100 may include a plurality of DM encoders 3 to execute a bit-level distribution matcher (see NPL 6).

Figure 13:
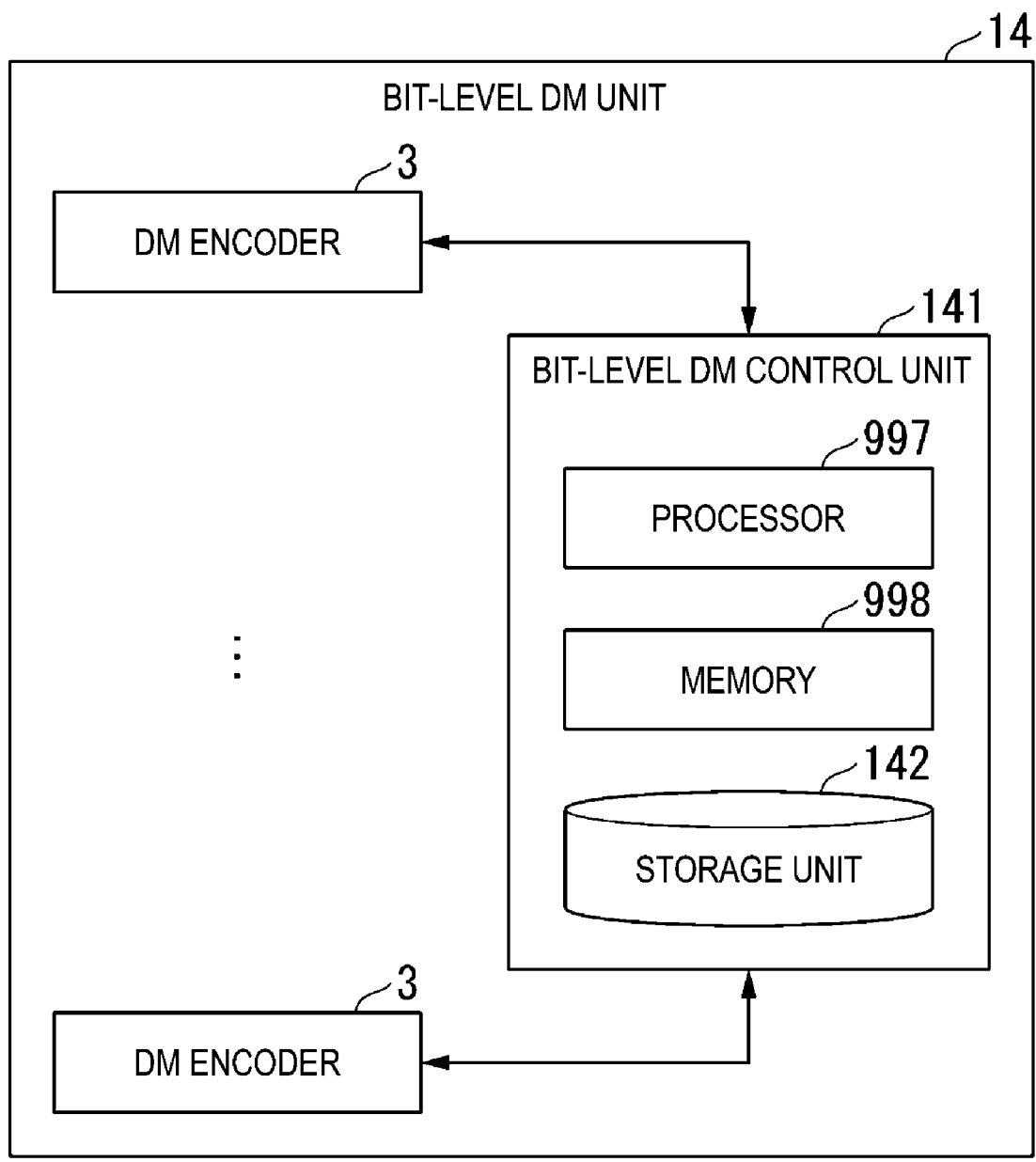
FIG. 13 is a diagram illustrating an example of a configuration of a bit-level DM unit 14 executing a bit-level distribution matcher according to a fourth modification example.

FIG. 13 is a diagram illustrating an example of a configuration of a bit-level DM unit 14 executing the bit-level distribution matcher according to a fourth modification example. The communication system 100 includes the bit-level DM unit 14 illustrated in FIG. 13 in place of the DM encoder 3 in FIG. 1. The bit-level DM unit 14 includes a plurality of DM encoders 3 and a bit-level control unit 141. The bit-level control unit 141 is communicatively connected to the plurality of DM encoders 3, and uses the plurality of DM encoders 3 to execute the bit-level distribution matcher.

The bit-level control unit 141 includes a processor 997 such as a CPU, a memory 998, and a storage unit 142 connected through a bus, and executes the program to execute the bit-level distribution matcher. More specifically, the processor 997 reads the program that is stored in the storage unit 142, and stores the read program in the memory 998. The processor 997 executes the program stored in the memory 998 to execute the bit-level distribution matcher.

The storage unit 142 is configured using a storage device such as a magnetic hard disk device or a semiconductor storage device. The storage unit 142 stores the program for executing the bit-level distribution matcher.

As described above, the communication system 100 including the bit-level DM unit 14 uses the plurality of DM encoders 3 to execute the bit-level distribution matcher to transform one input symbol sequence into an output symbol sequence. Thus, the communication system 100 described above can transform not only the input symbol sequence having the first symbol that is binary but also the input symbol sequence having the first symbol that is multi-valued.

Fifth Modification Example

Each of the transmission-side communication apparatus 12 and the reception-side communication apparatus 13 may be implemented using a plurality of information processing apparatuses communicably connected via a network. In this case, the functional units included in each of the transmission-side communication apparatus 12 and the reception-side communication apparatus 13 may be mounted in the plurality of information processing apparatuses in a distributed manner. For example, the bit symbol transformer 2, the DM encoder 3, the FEC encoder 4, and the modulator 5 may be implemented in different information processing apparatuses. For example, the demodulator 7, the FEC decoder 8, the DM decoder 9, and symbol bit transformer 10 may be implemented in different information processing apparatuses.

Note that all or part of each of the functions of each of the transmission-side communication apparatus 12 and the reception-side communication apparatus 13 may be implemented using hardware such as an application specific integrated circuit (ASIC), a programmable logic device (PLD), or a field programmable gate array (FPGA). The program may be recorded on a computer-readable recording medium. The computer-readable recording medium is, for example, a portable medium such as a flexible disk, a magneto-optical disk, a ROM, or a CD-ROM, or a storage device such as a hard disk incorporated in a computer system. The program may be transmitted via an electrical communication line.

Note that the DM encoder 3 is an example of an encoding unit. Note that the DM decoder 9 is an example of a decoding unit. Note that the bit-level DM unit 14 is an example of a bit-level distribution matcher unit.

Although the embodiment of the present invention has been described in detail with reference to the drawings, a specific configuration is not limited to the embodiment, and a design or the like in a range that does not depart from the gist of the present invention is included.

REFERENCE SIGNS LIST

100 Communication system
1 Bit string generator
2 Bit symbol transformer
3 DM encoder
4 FEC encoder
5 Modulator
6 Communication path
7 Demodulator
8 FEC decoder
9 DM decoder
10 Symbol bit transformer
11 Bit string output unit
12 Transmission-side communication apparatus
13 Reception-side communication apparatus
14 Bit-level DM unit
20 Control unit
21 Communication unit
22 Storage unit
30 Control unit
31 Communication unit
32 Storage unit
301 DM probability acquisition unit
302 DM transformation unit
991 Sending person
992 Receiving person
993 Processor
994 Memory
995 Processor
996 Memory

The invention claimed is:

1. A communication system comprising:
an encoding unit configured to transform an input symbol sequence into an output symbol sequence, the input symbol sequence being a sequence of first symbols, the output symbol sequence being a sequence of second symbols; and
a decoding unit configured to transform the output symbol sequence into the input symbol sequence in accordance with a decoding-side transformation mapping for transforming the output symbol sequence into the input symbol sequence that is a transformation source for the output symbol sequence, wherein the encoding unit transforms the input symbol sequence into the output symbol sequence in accordance with encoding-side transformation destination candidate information, the input symbol sequence, and a transformation probability, the encoding-side transformation destination candidate information being information indicating candidates of a transformation destination for the input symbol sequence, the transformation probability being a probability of transformation into the transformation destination indicated by the encoding-side transformation destination candidate information, and a probability of appearance of the second symbol conforms to a predefined prescribed probability distribution.

2. The communication system according to claim 1, wherein the encoding unit acquires, for each data point in the output symbol sequence, a probability of transformation into a candidate of a symbol represented by the data point, in accordance with the input symbol sequence, information indicating the probability distribution, and the decoding-side transformation mapping, and transforms the input symbol sequence into the output symbol sequence in accordance with the acquired probability.

3. The communication system according to claim 2, wherein the encoding unit performs, until a prescribed end condition is satisfied, a process for acquiring lost information and a process for acquiring, for each data point in the output symbol sequence, the probability of transformation into a candidate of a symbol represented by the data point, in accordance with the lost information, the lost information being information lost by performing a symbol probability acquiring process for acquiring, for each data point in the output symbol sequence, the probability of transformation into a candidate of a symbol represented by the data point, in accordance with the input symbol sequence, information indicating the probability distribution, and the decoding-side transformation mapping.

4. The communication system according to claim 3, wherein the lost information is represented by a sequence in which a difference between the input symbol sequence and an output symbol sequence generated in accordance with the probability acquired in accordance with the symbol probability acquiring process is added to the input symbol sequence.

5. The communication system according to claim 3, wherein the lost information is a probability, with respect to each candidate for the sequence representing the lost information that the candidate represents the lost information.

6. The communication system according to claim 2, wherein a method is belief propagation, the method being for the encoding unit to acquire, for each data point in the output symbol sequence, the probability of transformation into a candidate of a symbol represented by the data point, in accordance with the input symbol sequence, the information indicating the probability distribution, and the decoding-side transformation mapping.

7. A communication method comprising:
encoding by transforming an input symbol sequence into an output symbol sequence, the input symbol sequence being a sequence of first symbols, the output symbol sequence being a sequence of second symbols; and
decoding by transforming the output symbol sequence into the input symbol sequence in accordance with a decoding-side transformation mapping, the decoding-side transformation mapping transforming the output symbol sequence into an input symbol sequence that is a transformation source for the output symbol sequence,
wherein the encoding includes transforming the input symbol sequence into the output symbol sequence in accordance with encoding-side transformation destination candidate information, the input symbol sequence, and a transformation probability, the encoding-side transformation destination candidate information being information indicating candidates of a transformation destination for the input symbol sequence, the transformation probability being a probability of transformation into the transformation destination indicated by the encoding-side transformation destination candidate information, and
a probability of appearance of the second symbol conforms to a predefined prescribed probability distribution.

8. A non-transitory computer-readable medium having computer-executable instructions that, upon execution of the instructions by a processor of a computer, cause the computer to function as the communication system according to claim 1.

* * * * *